United States Patent
Okamoto et al.

(10) Patent No.: US 6,432,790 B1
(45) Date of Patent: Aug. 13, 2002

(54) METHOD OF MANUFACTURING PHOTOMASK, PHOTOMASK, AND METHOD OF MANUFACTURING SEMICONDUCTOR INTEGRATED CIRCUIT DEVICE

(75) Inventors: Yoshihiko Okamoto; Masamichi Kobayashi, both of Kodaira; Satoshi Momose, Higashiyamato, all of (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 09/943,499

(22) Filed: Aug. 31, 2001

(30) Foreign Application Priority Data

Oct. 30, 2000 (JP) .......................................... 2000-331000

(51) Int. Cl.[7] .............................................. H01L 21/331
(52) U.S. Cl. ........................................ 438/377; 438/669
(58) Field of Search ................................. 438/942–952, 438/669, 377; 430/311–313, 319, 5, 296, 326, 330

(56) References Cited

U.S. PATENT DOCUMENTS 5,629,113 A * 5/1997 Watanabe .................... 430/322
5,764,832 A * 6/1998 Tabuchi ....................... 385/14

FOREIGN PATENT DOCUMENTS

| JP | 2082244 | 3/1990 |
|----|---------|--------|
| JP | 5289307 | 11/1993 |
| JP | 5335203 | 12/1993 |
| JP | 6176408 | 6/1994 |
| JP | 9008103 | 1/1997 |
| JP | 9120986 | 5/1997 |
| JP | 11212250 | 8/1999 |

* cited by examiner

Primary Examiner—David Nelms
Assistant Examiner—David Vu
(74) Attorney, Agent, or Firm—Antonelli, Terry, Stout & Kraus, LLP

(57) ABSTRACT

The reliability of a photomask is improved. The planar shape of a mask substrate 1 of a resist shading mask having a shading pattern composed of a resist film is made circular.

26 Claims, 24 Drawing Sheets

NEXT METHOD OF MANUFACTURING SEMICONDUCTOR

METHOD OF MANUFACTURING PHOTOMASK, PHOTOMASK, AND METHOD OF MANUFACTURING SEMICONDUCTOR INTEGRATED CIRCUIT DEVICE

TECHNICAL FIELD OF THE INVENTION

The present invention relates to a method of manufacturing a semiconductor integrated circuit device, a method of manufacturing a photomask and a photomask technique, particularly to a technique useful for photolithography (referred to merely as lithography hereinafter) in which a given pattern is transferred to a semiconductor wafer (referred to merely as a wafer hereinafter) by exposure treatment using a photomask (referred to merely as a mask hereinafter) in the process of manufacturing a semiconductor integrated circuit device.

BACKGROUND OF THE INVENTION

An ordinary mask used in lithography technique is a member in which a shading pattern made of a metal film, such as a chromium film, is made on a mask substrate in a planar, rectangular form. However, the mask having this structure has a problem that costs thereof are high since the number of mask-producing steps is large and a problem that processing dimensional accuracy is lowered since the shading pattern is processed by isotropic etching. As proposal to avoid such problems, for example, Japanese Patent Laid-Open Publication No. 5-289307 discloses a technique in which the fact that about a given resist film its transmissivity of ArF excimer laser can be made to 0% is used and a shading pattern on a mask substrate is made of the resist film.

SUMMARY OF THE INVENTION

However, the present inventors have first found out that the above-mentioned mask technique in which the resist film is used as the shading pattern has the following problems.

First, in the case that the planar shape of the mask substrate of the mask in which the resist film is used as the shading pattern is made to a rectangular shape, very small residues of the resist film, released from the mask substrate, bounce off walls of a developing unit around the mask substrate when the resist film is developed and washed with the mask substrate being rotated in the principal plane thereof. The residues are then adhered to the principal plane of the mask, particularly the vicinity of the corners of the mask substrate, again. The adhered alien substances function as shading substances in the mask in which the resist film is used as a regular shading body. Therefore, if this mask is used to transfer the regular pattern onto a wafer, defects are also transferred.

Second, there remains a problem that the matter that costs of the mask are to be further lowered had not been taken into sufficient consideration. In recent years, costs of masks have been increasing in semiconductor integrated circuit devices. This is based on the following reasons. Since market scale is small in the field of mask-producing devices, masks are unprofitable. In such a situation, developing costs or running costs of drawing devices for forming a pattern on a mask or examination devices of examining the pattern become far higher as the pattern formed on a mask becomes finer and denser. To collect costs for this, mask costs must be made high. With an improvement in performance of semiconductor integrated circuit devices, the total number of masks necessary for producing one semiconductor integrated circuit device trends to increase. From this viewpoint, a reduction in mask costs is also an important theme.

The present inventors researched known examples of a mask on the basis of results of the present invention. As a result, for example, Japanese Patent Laid-Open Publication Nos. 11-212250 and 6-19121 disclose the following technique: in an ordinary mask using a metal film made of chromium or the like as a shading pattern, the planar shape of a mask substrate is made to a circular shape in order to improve the uniformity of a resist film for patterning the metal film.

For example, Japanese Patent Laid-Open Publication Nos. 9-120986 and 9-8103 disclose an aliment technique performed when a circular mask substrate of an ordinary mask in which a metal film made of chromium or the like is used as a shading pattern is set to an exposure device.

For example, Japanese Patent Laid-Open Publication No. 6-176408 discloses an exposure technique in which a circular substrate is exposed to light through a pattern of a circular mask.

For example, Japanese Patent Laid-Open Publication No. 5-335203 discloses a technique in which a large chip pattern is arranged on a circular mask substrate.

For example, Japanese Patent Laid-Open Publication No. 2-82244 discloses a technique of mark arrangement performed when a mask substrate is made circular.

An object of the present invention is to provide a technique making it possible to improve reliability of a mask.

Another object of the present invention is to provide a technique making it possible to improve the yield of semiconductor integrated circuit devices.

A further object of the present invention is to provide a technique making it possible to reduce costs for producing a mask.

The above-mentioned objects and other objects of the present invention, and new features thereof will be apparent from the description of the present specification and attached drawings.

A summary of typical aspects of the present invention disclosed in the present application is as follows.

According to the present invention, the planar shape of a mask substrate of a mask having a formed shading pattern composed of an organic film having the property of blocking off light for exposure is made circular.

The present invention comprises the step of forming a shading pattern composed of an organic film having the property of blocking off light for exposure on a mask substrate having a planar circular shape.

According to the present invention, in the outer circumferential end portion of the mask substrate having the planar circular shape, an edge of a first principal plane where the shading pattern composed of the organic film is formed is more largely chamfered than that of a second principal plane reverse to the first principal plane.

The present invention comprises the step of transferring the same patterns onto different areas of the mask substrate having the planar circular shape when the given pattern is transferred on the mask substrate, the step of using the photomask having the shading pattern composed of the organic film to expose a light-sensitive resin film on a substrate to be processed to light, and the step of comparing the same patterns transferred onto the different areas in the substrate to be processed with each other, to examine the quality of the pattern of the photomask.

According to the present invention, the diameter of the mask substrate having the planar circular shape is equal to or smaller than that of a substrate to be processed which is exposed to light using the mask substrate.

According to the present invention, a processing device for the mask substrate having the planar circular shape and a processing device for the semiconductor wafer are made common.

A summary of typical other aspects of the present invention disclosed in the present application is as follows.

According to the present invention, when an integrated circuit pattern is formed on a wafer, a laser beam or an electron beam is used to form an enlarged circuit pattern of a resist film on a transparent circular mask substrate, and then the resist pattern is used as a shading film to perform scale-down projective exposure using transmissible light from the mask, thereby transferring the integrated circuit pattern onto the semiconductor wafer.

According to the present invention, when an integrated circuit pattern is formed on a wafer, a phase shift pattern layer for reversing the phase of transmissible light and a resist shading pattern layer for blocking off the transmissible light are formed on a transparent circular mask substrate, and the transmissible light from the mask is used to perform scale-down projective exposure, thereby transferring the integrated circuit pattern onto the wafer.

The present invention, the resist is made to a monolayer structure of a chemically-sensitizing type resist or a bilayer structure having an antireflection film and a chemically-sensitizing type resist.

The present invention is a method of manufacturing a mask for scale-down projective exposure, comprising applying a resist onto a circular mask substrate, and using a laser beam or an electron beam to perform circuit-pattern exposure. The resist film is developed by combining rotation of the circular mask substrate with movement in the radial direction of the dropping and supplying position of a resist developing solution onto the circular mask substrate so as to spread the developing solution all over the substrate, and then rotating the circular mask substrate.

According to the present invention, after the developing treatment, the end face of the circular mask substrate and the back surface thereof are washed.

The present invention is the method of manufacturing the mask for scale-down projective exposure, wherein a developed pattern of the resist film is formed on the transparent circular mask substrate, the circular mask substrate is immersed into a washing solution, and subsequently the circular mask substrate is rotated, thereby performing developing and washing treatments.

According to the present invention, a chemically-sensitizing type resist is used as the resist, and an alkaline developing solution is used as the developing solution.

The present invention comprises the step of:
forming a shielding metal film on a circular transparent glass substrate,
forming a window for an integrated circuit pattern transferring area on the circular transparent glass substrate and making an alignment mark for forming the integrated circuit pattern and an alignment mark for a scale-down projective exposure device therein,
using the alignment mark to form an enlarged resist circuit pattern on the circular transparent glass substrate, and
using the resist on the circular transparent glass substrate as a shading film for blocking off light for exposure to perform scale-down projective exposure, thereby transferring a circuit pattern onto a wafer.

The present invention comprises the step of:
forming a shielding metal film on a circular transparent glass substrate,
forming a phase shift pattern, which is one of integrated circuit patterns, on the circular transparent glass substrate and making an alignment mark for forming the integrated circuit patterns and an alignment mark for a scale-down projective exposure device therein,
using the alignment mark to form an enlarged resist circuit pattern on the circular transparent glass substrate, and
using the resist on the circular transparent glass substrate as a shading film for blocking off light for exposure to perform scale-down projective exposure, thereby transferring a circuit pattern onto a wafer.

According to the present invention, the resist circuit pattern formed on the circular transparent glass substrate by using the alignment mark is composed of the same patterns, and the mask pattern is examined by comparison-examination of the patterns transferred on the wafer.

The present invention is a manner in which at the time of producing an integrated circuit device, a laser beam or an electron beam is used to form an enlarged circuit pattern on a circular mask substrate, and then transmissible light from the circular mask substrate is used to perform scale-down projective exposure, thereby transferring a scale-down circuit pattern onto a wafer. The diameter of the circular mask is made equal to or smaller than that of the wafer.

According to the present invention, in the circular mask substrate, an edge of a principal plane of the end face of the substrate is largely chamfered. While the circular mask substrate is rotated, the mask substrate is subjected to developing treatment, and then the end face of the substrate and the back surface thereof are washed, thereby forming an enlarged circuit pattern on the substrate. The resultant product is used for transfer onto the wafer.

BRIEF DESCRIPTION OF THE DRAWINGS

FIG. 2A is a plan view of the resist shading mask, and FIG. 2B is an enlarged sectional view of a main portion thereof;

DESCRIPTION OF THE PREFERRED EMBODIMENTS

Figure 1A:
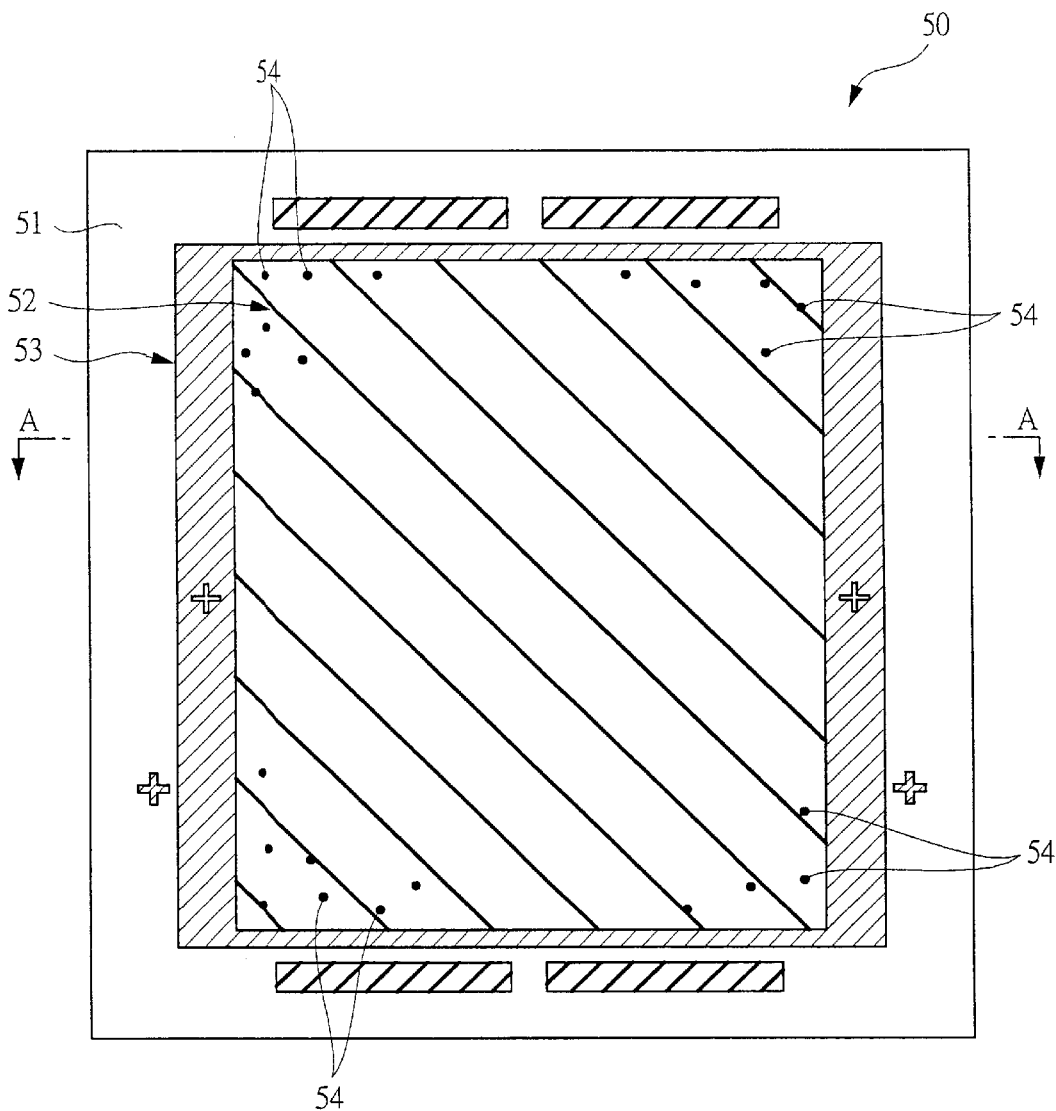
FIG. 1A is a plan view of a photomask investigated by the inventors.

The meanings of terms used in the present application will be described before the present invention is described in detail.

1. Mask (optical mask): a member in which a shading pattern for blocking off light or a pattern for changing the phase of light is formed on a mask substrate. The term also indicates a reticle in which a pattern having a size several times actual size is formed. A first principal plane of the mask is a pattern plane in which the above-mentioned shading pattern or light phase changing pattern is formed, and a second principal plane is a plane opposite to the first principal plane (that is, a rear plane).

2. Ordinary mask: a usual mask in which a mask pattern composed of a shading pattern made of a metal and a light-transmissible pattern is formed on a mask substrate.

3. Phase shift mask: a mask having a means for generating different phases in light for exposure transmitting through a mask. Its phase shifter is classified into, for example, grooves which have a given depth and are made in a mask substrate and a transparent film or semitransparent film which has a given thickness and is deposited on a mask substrate.

4. Halftone mask: a kind of phase shift mask. The halftone mask has a halftone shifter which has a halftone film use both as a phase sifter and a shading film and having a transmissivity of 1% or more and less than 40%, and which has an amount of phase shift, when compare to portion which have no transmissivity, which causes the phase of light to be reversed.

5. Resist shading mask: a mask having, on a mask substrate, a shading body (a shading film, a shading pattern or a shading area) made of an organic material. The organic material referred to herein includes, as examples, a single film comprising a light-sensitive resin (resist) film, a light-sensitive resin film to which a light-absorbing material or a light-reducing material is added, and a lamination film composed of a light-sensitive resin film and some other film (for example, an antireflection film, an light-absorbing resin film or a light-reducing resin film).

6. The pattern plane of the mask (the above-mentioned ordinary mask or resist mask) is classified into the following: an "integrated circuit pattern area", which is an area where an integrated circuit pattern that should be transferred is arranged, and a "circumferential area", which is an area around the integrated circuit pattern area.

7. In the case that the wording "shading body", "shading area", "shading film" or "shading pattern" is used, the object represented by this wording has an optical property that less than 40% of light for exposure which is radiated onto the object is transmitted. The object which is generally used has a transmissivity of several % to less than 30%. In the case that the wording "transparent", "transparent film", "light-transmissible area" or "light-transmissible pattern" is used, the object represented by this wording has an optical property that 60% or more of light for exposure which is radiated onto the object is transmitted. The object which is generally used has a transmissivity of 90% or more.

8. Wafer: a silicon monocrystal substrate used to produce an integrated circuit (generally, in a substantially planar, circular form); a sapphire substrate; a glass substrate; other insulating, anti-insulating or semiconductor substrates; a composite substrate made of two or more thereof; and the like. Semiconductor integrated circuit devices referred to in the present application include not only semiconductor integrated circuit devices formed on a semiconductor or an insulator substrate such as a silicon wafer or a sapphire substrate, but also semiconductor integrated circuit devices formed on some other insulator substrate such as a thin film transistor (TFT), super twisted nematic (STN) liquid crystal.

9. Device plane: the principal plane of a wafer. On the principal plane, a device pattern corresponding to plural chip areas is formed by lithography.

10. Transferred pattern: a pattern transferred onto a wafer through a mask. Specifically, the transferred pattern is a resist pattern or a pattern, on a wafer, which is actually formed using the resist pattern as a mask.

11. Resist pattern: a film pattern patterned by subjecting a light-sensitive resin film to photolithography. This pattern includes a resist film having no opening.

12. Normal illumination: non-transformational illumination, which is illumination whose light intensity distribution is relatively uniform.

13. Transformational illumination: illumination whose illuminance at the center is lowered. Examples thereof include oblique illumination, orbicular zone illumination, multi-pole illumination such as quadrupole illumination and quintet pole illumination, and ultra-resolution technique, based on a pupil filter, equivalent thereto.

14. Scanning exposure: an exposure method for transferring a circuit pattern of a mask onto a desired area of a wafer by scanning (continuously-moving) an exposure band, which is in a slender slit form, relatively to the wafer and the mask in the direction perpendicular (or obliquely) to the longitudinal direction of the slit.

15. Step and scan exposure: a method of combining the above-mentioned scanning exposure with stepping exposure so as to subject the whole of an area to be exposed in a wafer to exposure treatment. The step and scan exposure is a subordinate concept of the scanning exposure.

16. Step and repeat exposure: an exposure method of transferring a circuit pattern of a mask onto a desired area of a wafer by stepping the wafer repeatedly to a projected image of the circuit pattern of the mask.

17. In the phrase "a mask substrate in a planar, circuit form", the wording "planar, circuit form" includes the meaning of a complete circle, an ellipse, and a polygon similar to a circuit (for example, an octagon).

In the following embodiments, if expediential necessary, the present invention is divided to plural sections or embodiments. The divided ones are related with each other except cases in which the matter that they are unrelated with each other is clearly described. The divided one is a modification example, a detail, a supplementary description and so on of a part or the whole of the other.

When the number of elements, quantity, ranges, and so on are specified by numerical values in the following embodiments, the numerical values are not restrictive except cases in which the intention of limitation is clearly described or limitation is clear from principle. Thus, values more than or less than the described numerical values, for example, similar numerical values may be applied to the embodiments.

In the following embodiments, constituent elements (including steps and so on) thereof are not necessarily essential except cases in which the matter that the elements are essential is clearly described or is clear from principle.

When the shape, the positional relationship and so on of the constituent members are specified in the following embodiments, the shape, the positional relationship and so on are not restrictive except cases in which the intention of limitation is clearly described or limitation is clear from principle. Thus, similar shape, positional relationship and so on may be applied to the embodiments.

In all of the drawings referred to in order to describe the embodiments, the same reference number is attached to members having the same function, and repeated description thereof is omitted.

In the drawings, shading bodies (a shading film, a shading pattern, a shading area and so on), a resist film and so on are hatched in order to make the drawings easy to see even if the drawings are plan views.

In the present embodiments, a metal insulator semiconductor field effect transistor (MISFET), which is a typical example of field effect transistors, is abbreviated to MIS. A p-channel type MISFET is abbreviated to pMIS, and an n-channel type MISFET is abbreviated to nMIS.

Referring to the drawings, the embodiments of the present invention will be described in detail hereinafter.

(Embodiment 1)

The inventors made investigations on the above-mentioned resist shading mask. The following technique is not a known technique, but is a technique investigated by the inventors. An outline thereof is as follows.

Figure 1B:
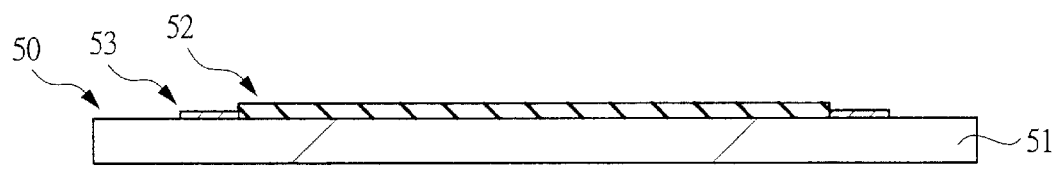
FIG. 1B is a sectional view taken along A—A line of FIG. 1A.

FIG. 1 is a plan view of a resist shading mask 50, which is an example of resist shading masks investigated by the inventors. A mask substrate 51 is made of a transparent synthetic quartz having a planar, rectangular shape. In an integrated circuit pattern area 52 at the center of the mask substrate 51, a shading pattern made of an organic material such as a resist film is arranged. A shading pattern 53 in a planar, frame form, which is made of a metal film such as a chromium (Cr) film, is formed around the integrated circuit pattern area 52.

The inventors found out the following problem: in the case of such a resist shading mask 50, countless microscopic alien substances 54 adhere to peripheral portions of the mask substrate 51 at the time of a developing step, a subsequent washing step and the like steps for forming the shading pattern made of the organic material. According to the experiments by the present inventors, which demonstrated the following: the microscopic alien substances 54 having a size of about 0.5 μm or less are detected at the peripheral portions of the mask substrate 51, particularly at the vicinity of corners thereof, when the mask substrate 51 is examined with a mask examination device.

Figure 2A:
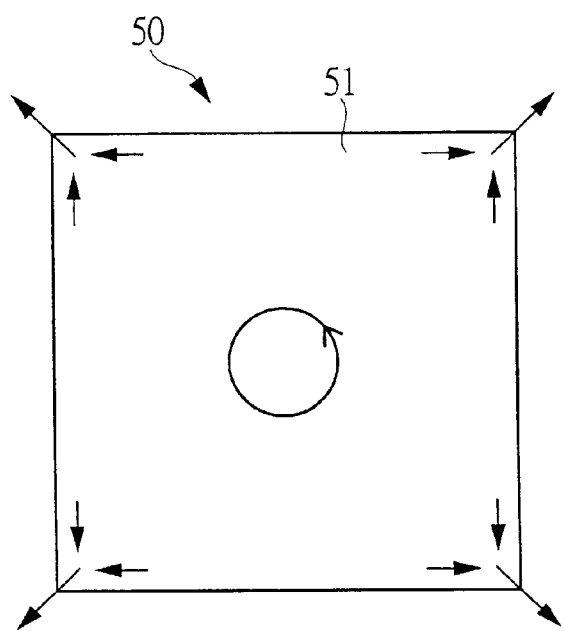
FIGS. 2A and 2B are views for explaining problems caused when the photomask illustrated in FIG. 1 is used, namely
Figure 2B:
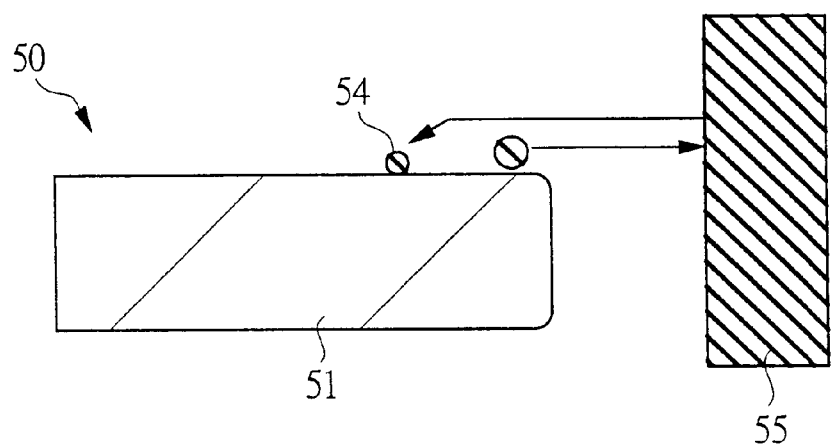

This would be based on the following reason. FIGS. 2A and 2B are views for explaining the reason. FIG. 2A is a plan view of the resist shading mask 50, and FIG. 2B is an enlarged sectional view of a main portion thereof. As illustrated in FIG. 2, if the developing step and the washing step are performed while the resist shading mask 50 is rotated, residues of the resist film concentrates at the four corners of the mask substrate 51 in the case that the planar shape of the mask substrate 51 is rectangular. The concentrating residues of the resist strike on a wall 55 of the developing device or the like, and then rebound to adhere again to the surface of the mask substrate 51 (particularly, the vicinity of the corners of the first principal plane of the mask substrate 51). In the case of the above-mentioned ordinary mask, the problem is not caused by patterning the metal film made of chromium or the like by wet etching, and then washing the mask substrate with ozone sulfuric acid or the like.

In the case of the resist shading mask 50, even the foreign matter 54 having a thickness of, for example, about 150 nm functions sufficiently as a shading body. Therefore, transfer-defects are generated on a wafer. That is, if this resist shading mask 50 is used to perform exposure to transfer the pattern onto a wafer, defects are also transferred. Accordingly, in the case of the resist shading mask, developing and washing manners for the ordinary mask cannot be used as they are.

Figure 3A:
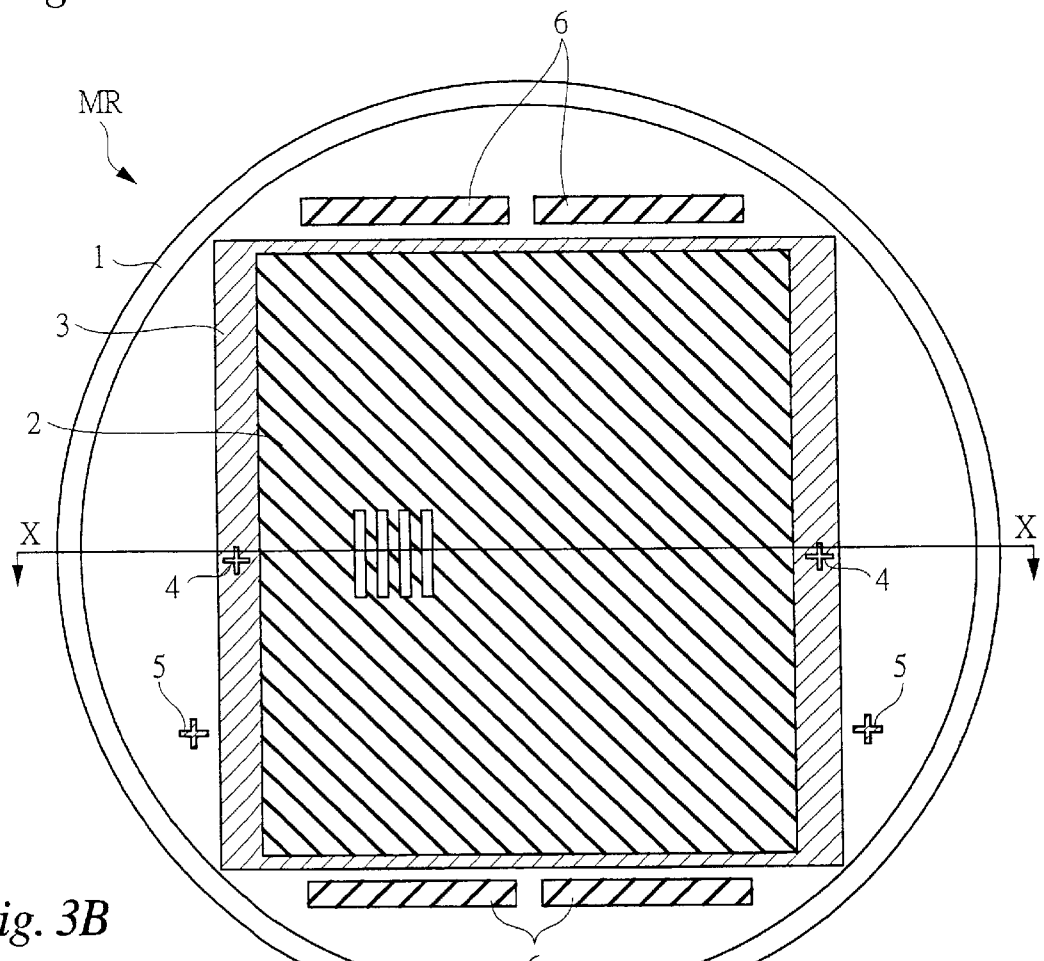
FIG. 3A is a plan view of the whole of a resist shading mask which is one embodiment of the present invention.
Figure 3B:
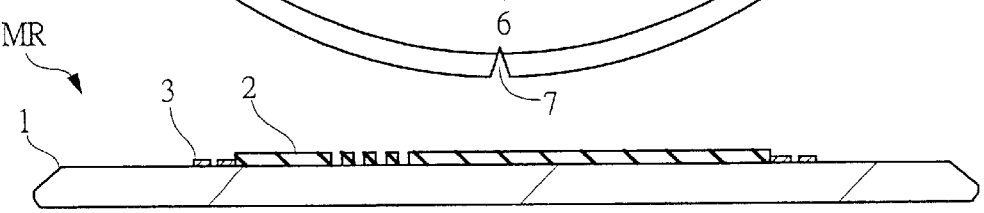
FIG. 3B is a sectional view taken along X—X line of FIG. 3A.
Figure 3C:
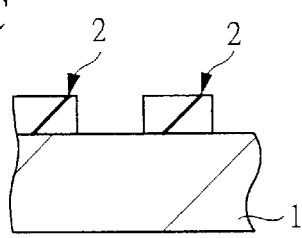
FIG. 3C is a sectional view of a main portion in FIG. 3A.
Figure 3D:
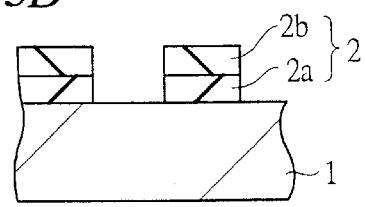
FIG. 3D is a main portion in FIG. 3A, which illustrates a modification example of the shading pattern.

Thus, in the present embodiment, the planar shape of the mask substrate of the resist shading mask is made circular. FIGS. 3A to 3D illustrate a resist shading mask (mask) MR of the present embodiment. FIG. 3A is a plan view of the whole of the resist shading mask MR, FIG. 3B is a sectional view taken along X—X line of FIG. 3A, FIG. 3C is a sectional view of a shading pattern of an organic material, and FIG. 3D illustrates a modified example of the shading pattern illustrated in FIG. 3C. FIGS. 4 and 5 are side views of main portions of the mask substrate 1 constituting the resist shading mask MR.

The mask substrate 1 of the resist shading mask MR is composed of, for example, a synthetic quartz substrate, and is formed, for example, in a planar circular form. This makes it possible to disperse residues of the resist film without concentrating at a part of the periphery of the mask substrate 1 at the time of a developing step and a subsequent step for forming a shading pattern made of an organic material. Therefore, the problem of adhesion of microscopic alien substances based on rebound of the residues of the resist film can be sufficiently reduced or lost. For this reason, the problem that defects are transferred onto a wafer by exposure using this resist shading mask MR can be reduced or prevented. Therefore, the reliability and yield of semiconductor integrated circuit devices can be improved. The washing step after the development can also be made easy.

Figure 4A:
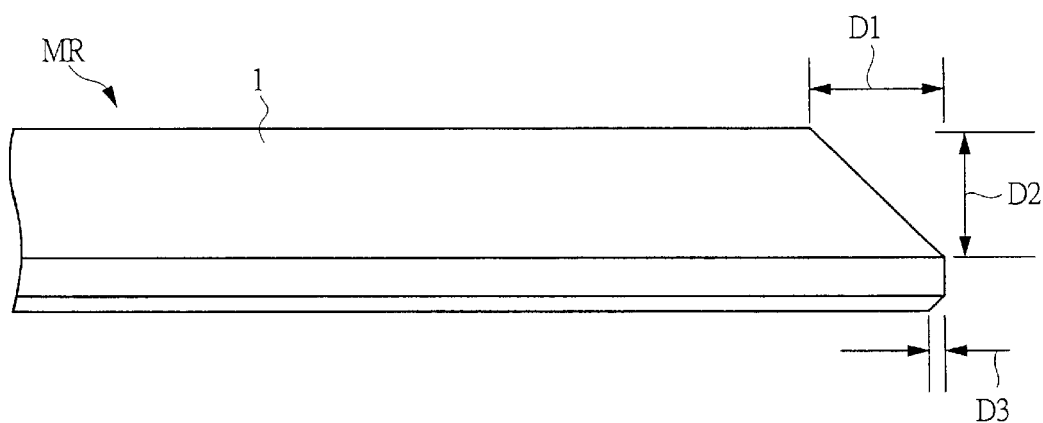
FIG. 4A is a sectional view of a main portion of a mask substrate in the resist shading mask illustrated in FIG. 3, and 4B is also a sectional view of a main portion of a mask substrate in the resist shading mask illustrated in FIG. 3.
Figure 4B:
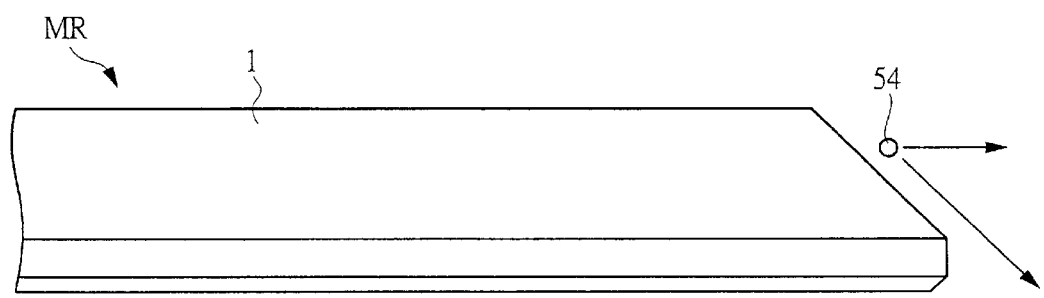
Figure 5:
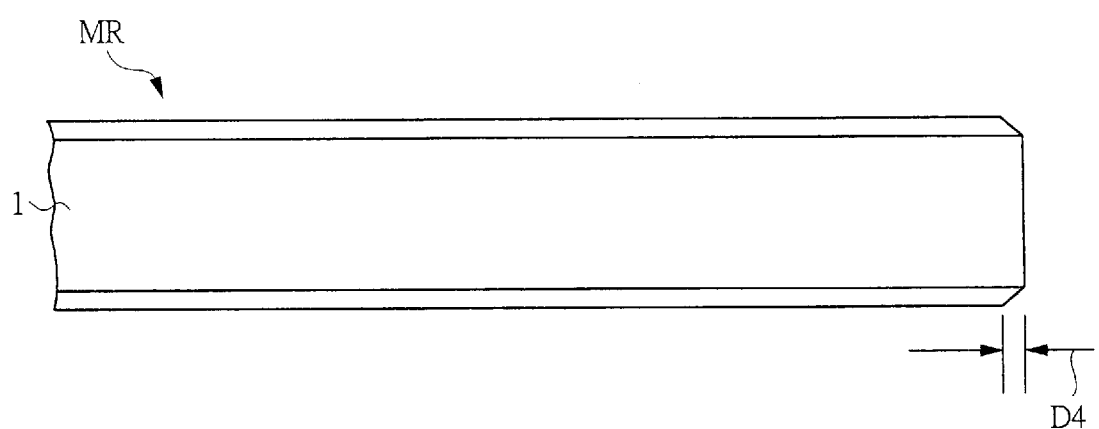
FIG. 5 is a side view of a main portion of a modification example of the mask substrate in the resist shading mask illustrated in FIG. 3.

As illustrated in FIGS. 4A and 4B, in the circumferential end of the mask substrate 1, the first principal plane is more largely chamfered than the second principal plane so that the first and second principal planes are asymmetrically chamfered. As illustrated in FIG. 4B, this makes it possible to release the alien substances 54, such as the residues of the resist film, in the downward direction in this figure, so as to reduce or lose the alien substances 54 adhering again to the first and second principal planes of the mask substrate 1 after the rebound of the residues on the wall of the processing device. By chamfering the circumferential end of the mask substrate 1 and making the thickness of the end face (i.e., the length of the face not shaved by the chamfering) short, the amount of the alien substances, such as the residues of the resist film, adhering to the end face can be reduced. Each of the dimensions D1 and D2 in FIG. 4A is, for example, about 3.2 mm, and the dimension D3 is, for example, about 0.6 mm.

As illustrated in FIG. 5, however, the circumferential end of the mask substrate 1 is symmetrically chamfered at the first and second principal plane sides. The dimension D4 is, for example, from about 0.1 to about 0.6 mm.

About the size of the mask substrate 1 in the present embodiment, its diameter and its thickness are set to 8 inches (=about 200 mm) and 0.25 inch (=about 6.35 mm), which are made equal to those of the wafer. This is because it is made possible to perform the steps of developing the resist shading mask MR and washing it, and the like steps, which will be described later, by means of a processing device in a wafer-producing line (i.e., a producing line of semiconductor integrated circuit devices). In other words, it is difficult to use any mask having a planar rectangular shape in a wafer-processing device. Thus, it is necessary to prepare separately a processing device exclusive for such a mask. As a result, mask costs become high and costs of semiconductor integrated circuit devices also become high. However, by making the diameter of the mask substrate 1 equal to or smaller than that of the wafer and supplying a carrying member, the steps of developing the resist shading mask MR and washing it and the like steps can be performed in a processing device in a wafer-producing line. In short, the same processing device can be used in the mask-producing line and the wafer-producing line. For this reason, mask costs can be reduced and costs of semiconductor integrated circuit devices can also be reduced. Although the wafer and the mask have different thermal capacities, the steps of baking the wafer and the mask can be performed in the same device by changing processing temperature and processing time.

At the center of the first principal plane of the mask substrate 1 illustrated in FIG. 3, an integrated circuit pattern having, for example, a rectangular shape is arranged. In this integrated circuit pattern, a shading pattern 2 for transferring the integrated circuit pattern is formed. This shading pattern 2 is formed of a single film made of a light-sensitive resin (i.e., resist), as illustrated in FIG. 3C. Therefore, the shading pattern 2 can easily be removed and reproduced in a short time. The resist film for forming this shading pattern 2 has a nature of absorbing a light beam for exposure, such as a KrF excimer laser (wavelength: 248 nm), an ArF excimer laser (wavelength: 193 nm), a $F^2$ laser (wavelength: 157 nm), and has a shading function substantially similar to that of a shading pattern made of a metal. The resist film making the shading pattern 2 is made mainly of, for example, a copolymer of α-methylstyrene and α-chloroacrylic acid, Novolak resin and quinone diazide, Novolak resin and polymethylpentene-1-sulfone, chloromethylated polystyrene, or the like. The resist film may be made of the so-called chemically-sensitizing type resist, in which an inhibitor and an acid-generator are mixed with a phenol resin such as polyvinylphenol resin, or Novolak resin. The material of the shading resist film used herein should have a property of blocking off light from a light source of a projective exposure device and a property of having sensitivity to light from a light source of a pattern-drawing device used in a mask-producing process, for example, an electron beam or light having a wavelength of 230 nm. The material is not limited to the above-mentioned material, and can be varied.

In the case that polyphenol type resin or Novolak resin is made to a film having a thickness of about 100 nm, its transmissivity is about zero at a wavelength of, for example, about 150 to about 230 nm. Thus, the film has a sufficient masking effect against an ArF excimer laser, a $F^2$ laser having a wavelength of 157 nm, or the like. In the present embodiment, vacuum ultraviolet rays having wavelengths of 200 nm or less are used, but the light which can be used is not limited thereto. It is also allowable to use light for exposure having a longer wavelength than 200 nm, such as a KrF excimer laser (wavelength: 248 nm) or an i-ray (wavelength: 365 nm). In this case, it is necessary to use a different resist material, or to add an absorbing material or a shading material to the resist film. As illustrated in FIG. 3D, it is allowable to make the shading pattern into a lamination structure having, on an organic film (first organic film) 2a having a property of blocking off or absorbing light for exposure having a wavelength of 200 nm or more, a resist film (second organic film) 2b having sensitivity to pattern-drawing light. The technique in which a shading pattern is made to a lamination structure of an organic film having light-absorbance and an organic film having light-sensitivity is described in Japanese Patent Applications Nos. 2000-328159 (filed on Oct. 27, 2000) and No. 2000-328160 (filed on Oct. 27, 2000) based on an invention made by Tanaka et al.

To improve resistance against irradiation with light for exposure, it is effective to perform the so-called hardening treatment of the resist film, such as thermal treatment or intense irradiation with ultraviolet rays, after the formation of the shading pattern made of the organic material. In order to prevent the shading resist film from being oxidized, the pattern plane is kept in the atmosphere of an inert gas such as nitrogen ($N^2$). The pattern-drawing of the resist film can be carried out by an electron beam or ultraviolet rays having wavelengths of, for example, 230 nm or more. The numerical values, the materials and so on exemplified herein are mere examples for supplying practical resist shading masks. Other numerical values and materials may be used. A technique in which a resist film is used to form a shading pattern is described in Japanese Patent Application No. 11-185221 (filed on Jun. 30, 1999) based on an invention made by Hasegawa et al.

The circumference of the integrated circuit pattern area is surround by a shading pattern 3 in a planar, frame form. This shading pattern 3 is formed of a metal film, such as a chromium film. However, the material of the shading pattern 3 is not limited thereto, and can be varied. The material may be, for example, a high melting point metal such as tungsten, molybdenum, tantalum or titanium, a nitride such as tungsten nitride, a high melting point metal silicide (compound), such as tungsten silicide (WSix), or molybdenum silicide (MoSix), or a lamination film thereof. In the case of the resist shading mask MR in the present embodiment, after the removal of the shading pattern 2 made of the organic material, the mask substrate 1 may be washed and used again. Therefore, the shading pattern 3 which is caused to remain on the mask substrate 1 at any time is preferably made of a material having good stripping-resistance and abrasion-resistance. Since the high melting point metals, such as tungsten, have good oxidation-resistance, abrasion-resistance, and stripping-resistance, they are preferred for the material of the shading pattern 3. The shading pattern 3 is not made of the metal film, but may be made of the above-mentioned organic material.

Each of alignment marks 4 (light-transmissible patterns for detecting information) is attached to a part of the shading pattern 3. The alignment mark 4 is formed by removing a part of the shading pattern 3. The alignment mark 4 in a planar cross shape is exemplified, but the shape of the alignment mark 4 is not limited thereto, and can be varied. Such a structure makes it possible to keep the precision of the position-detection of the resist shading mask MR. In other words, in the case that an ordinary halogen lamp is used to detect the position of the mask, the contrast of detecting light cannot be sufficiently obtained if the alignment mark 4 is made of the same material as the shading pattern 2. However, if the alignment mark 4 is formed by removing a part of the shading pattern 3 formed of the metal film, the contrast of light which transmits through the mark pattern 4 can be sufficiently obtained. Therefore, the cognitive capability of the mark pattern 4 can be improved. For this reason, the relative alignment between the resist shading mask MR and an exposure device can be performed at ease and with high precision. Results of the inventors proved that the alignment equivalent to the alignment of the ordinary mask can be attained. The mark pattern 4 is not transferred onto a wafer.

Alignment marks 5 for forming a resist pattern and cognitive areas 6 are formed outside the shading pattern 3. The alignment marks 5 are formed by patterning the same metal film as constitutes the shading pattern 3 at the same time of forming the shading pattern 3. The alignment marks 5 in a planar cross shape is exemplified, but the shape of the marks is not limited thereto, and can be varied. In this case, for the same reason as above, the cognitive capability of the mark patterns 5 can be improved and pattern-matching precision can be improved, as well. In the cognitive areas 6, information on a product name, a step name or the like is described as a cognitive pattern such as characters, a symbol or a bar code. The cognitive patterns are formed by patterning the same metal film as constitutes the shading pattern 3 at the same time of forming the shading pattern 3. In this way, the cognitive capability of the cognitive pattern can be improved for the same reason as for the mark patterns 4 and 5.

Any member including the shading pattern made of the organic material is not formed in the outer circumferential area of the shading pattern 3. This is based on the following reason. If the resist film and the like are formed in this circumferential area, they are stripped or scraped by mechanical impact or the like when the resist shading mask MR is set up to a mask examination device, an exposure device or the like. As a result, they turn to alien substances. To prevent this phenomenon, no member is formed in the circumferential area.

Figure 6A:
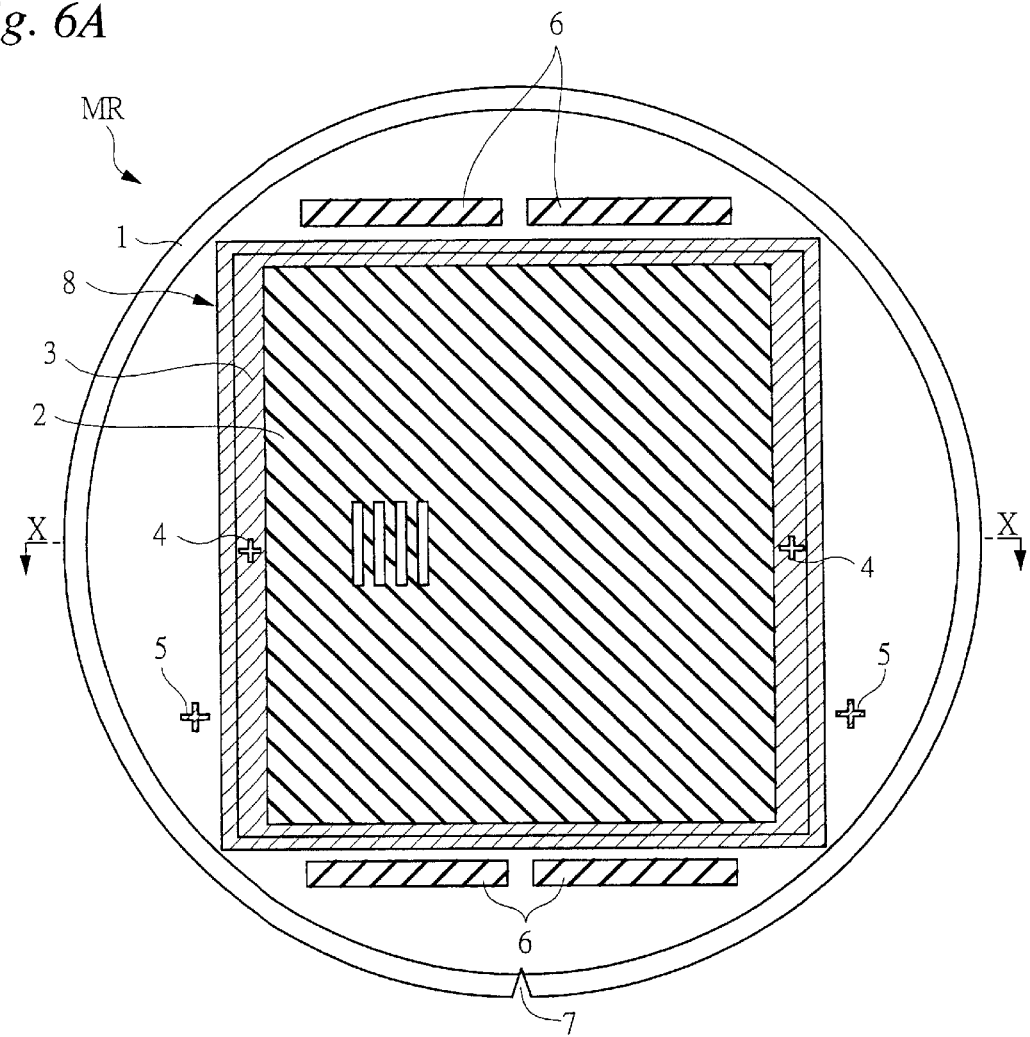
FIG. 6A is a plan view of the whole of mask substrate in the case that a pellicle is set to the resist shading mask illustrated in FIG. 3.
Figure 6B:
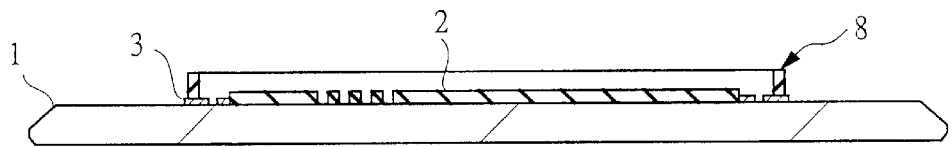
FIG. 6B is a sectional view taken along X—X line of FIG. 6A.

A part (spot) of the outer circumference of the mask substrate 1 is cut to form a rotation matching mark 7. This mark 7 is formed to match with a rotation matching mark of a wafer. This makes it possible to perform the relative two-dimensional positioning between the mask substrate 1 and the wafer more satisfactorily. As illustrated in FIG. 6, in the same way as in the case of the ordinary mask, by fitting a pellicle 8 for preventing adhesion of alien substances to the first principal plane of the mask substrate 1, it is possible to prevent any alien substance on the first principal plane of the mask substrate 1 from being transferred onto the wafer. Legs of the pellicle 8 are jointed to the shading pattern 3 made of the metal film for the following reason. In the case that the legs of the pellicle 8 are jointed to the shading pattern 2 made of the organic material, the following is caused: the pellicle 8 is easily stripped, or when the pellicle 8 is taken off, the shading pattern 2 is stripped together with the pellicle 8 to generate alien substances. To avoid such a phenomenon, the legs of the pellicle 8 are jointed to the shading pattern 3.

The following will describe an example of a method of manufacturing the resist shading mask MR. FIGS. 7A to 7D respectively illustrate a section of a main portion of the integrated circuit pattern area of the mask substrate 1 in the process of manufacturing the resist shading mask MR.

Figure 7A:
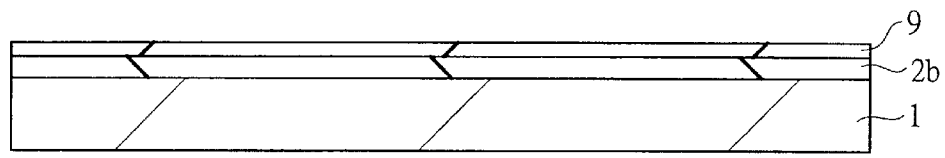
FIG. 7A is a sectional view of a main portion of an integrated circuit pattern area of a mask substrate in the process of manufacturing a resist shading mask having the structure illustrated in FIG. 3C.

FIG. 7A illustrates a stage after the frame-form shading pan 3 made of the metal film is formed on the first principal plane of the mask substrate 1 by etching, and then ozone sulfuric acid is used to wash the etched product. The surface of the mask substrate 1 is subjected to surface-treatment with hexamethyl disilazane (HMDS). First, a resist film 2b for forming a shading body is applied onto the first principal plane of the mask substrate 1, and subsequently an electroconductive film 9 is applied onto the resist film 2b to prevent charging-up at the time of drawing with an electron beam. The used resist film 2b may be, for example, a chemically-sensitizing type electron beam resist RE-5150 made by Hitachi Chemical Co., Ltd. The resist film 2b is applied to have a thickness of, for example, about 400 nm. The applied electroconductive film 9 may be, for example, an electroconductive polymer, Espacer 100 made by Showa Denko KK.

Figure 7B:
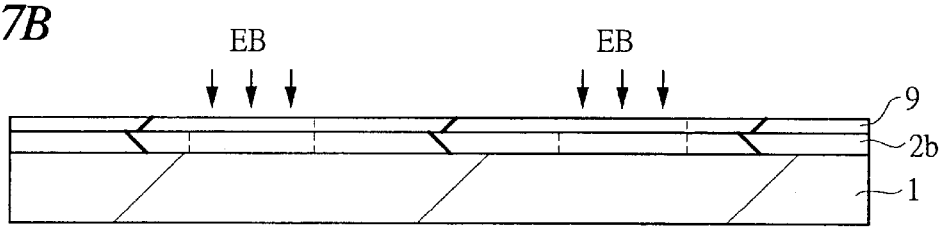
FIG. 7B is also a sectional view of a main portion of the integrated circuit pattern area of a mask substrate.
Figure 7C:
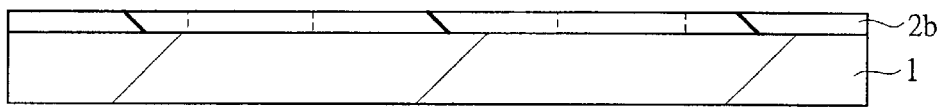
FIG. 7C is a further sectional view of a main portion of an integrated circuit pattern area of a mask substrate.

Subsequently, as illustrated in FIG. 7B, an electron beam is radiated onto given positions in the resist film 2b to draw an integrated circuit pattern. In order that the resist film 2b does not remain in the outer circumferential area of mask substrate 1, the outer circumferential area is also exposed to the electron beam. According to the present embodiment, by making the planar shape of the mask substrate 1 circular, the exposed circumferential area can be made smaller than that in the case that the planar shape of the mask substrate 1 is rectangular. Therefore, the time for exposing the circumferential area can be made short to improve throughput. The used electron beam lithography system may be, for example, an electron beam drawing device HL-800D made by Hitachi, Ltd. According to this device, a circuit pattern can directly be drawn on a wafer. As a technique for forming a circuit pattern on a photomask, the manner of exposure to an electron beam and the manner of exposure to a laser beam are made practicable. However, devices for the manners are generally expensive. Thus, as circuit patterns become finer, the processing capability thereof becomes smaller. This is a factor for making costs of masks high. According to the present embodiment, however, by making the diameter of the mask substrate 1 equal to or slightly smaller than that of the mask, a pattern drawing device can commonly be used in the mask-producing line and the wafer-producing-line. Therefore, costs of masks and semiconductor integrated circuit devices can be reduced. Thereafter, the electroconductive film 9 is removed and baked as illustrated in FIG. 7C by dropping pure water onto the electroconductive film 9 while rotating the mask substrate 1 around the center of the first principal plane.

Figure 7D:
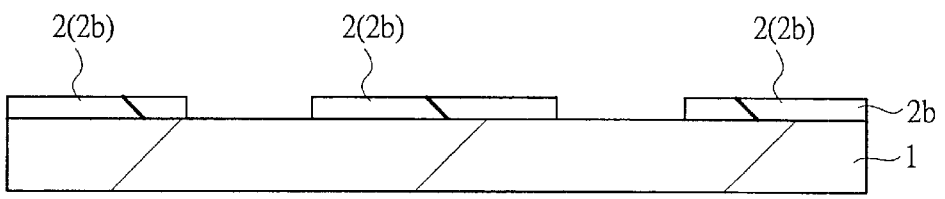
FIG. 7D is a still further sectional view of a main portion of the integrated circuit pattern area of a mask substrate.

Next, the mask substrate 1 is developed while rotating the mask substrate 1 around the center of the first principal plane. As a developing solution, an alkali developing solution NMD-3 made by Tokyo Ohka Kogyo Co., Ltd. is used. Subsequently, surfaces including the circumferential end face of the mask substrate 1 and the second principal plane are washed and baked while the mask substrate 1 is rotated as described above. By using the alkali developing solution as the developing solution for the development in this way, the mask substrate 1 can easily be washed with pure water in the present washing treatment. Thereafter, the mask substrate 1 is subjected to ashing treatment with oxygen to remove a thickness of about 10 nm. Thus, by removing residues of the resist film and so on, the shading pattern 2 made of the resist film 2b is formed, as illustrated in FIG. 7D, so as to produce the resist shading mask MR. A plurality of the same circuit patterns are formed on the mask substrate 1 of the resist shading mask MR. By exposing a wafer through the patterns of the resist shading mask MR and then comparison-examining the same circuit patterns transferred onto different unit areas, it is checked whether or not an abnormality is generated in the resist shading mask MR. By examining the patterns of the resist shading mask MR with a pattern-examining device in this way, no expensive pattern-examining device for the resist shading mask MR becomes necessary, so that costs of the resist shading mask MR can be reduced.

As described above, the followings are performed while the mask substrate 1 is rotated: application of the resist film 2b, application of the electroconductive film 9, removal of the electroconductive film 9, development, washing, and so on. According to the present embodiment, by making the planar shape of the mask substrate 1 circular and chamfering the first principal plane more largely than the second principal plane in the circumferential end portion of the mask substrate 1, alien substances (for example, the residues of the resist film 2b adhering to the first and second principal planes of the mask substrate 1) can be reduced up to an insignificant extent or can be lost in removal of the electroconductive film 9, the development of the resist film 2b, the subsequent washing, and so on.

According to the present embodiment, by making the diameter of the mask substrate 1 equal to or slightly smaller than that of the wafer, various devices, for example, the device for applying the electroconductive film 9 or the resist film 2b, the pattern-drawing device, the developing device and the washing device, can commonly be used (inside the same clean room) in the mask-producing-line and the wafer-producing-line. Therefore, costs of masks and semiconductor integrated circuit devices can be reduced. A technique in which a mask-producing-line and a wafer-producing line are present in the same clean room is described in Japanese Patent Application No. 2000-316965 (filed on Oct. 17, 2000) based on an invention made by Hasegawa et al.

FIGS. 8A to 8D respectively represent a section of a main portion of the integrated circuit pattern area of the mask substrate 1 in the process of manufacturing the resist shading mask MR having the bilayer structure comprising the organic film having light-absorbance and the resist film having light-sensitivity, illustrated in FIG. 3D.

Figure 8A:
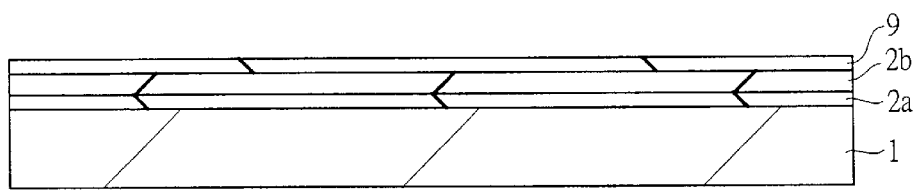
FIG. 8A is a sectional views of a main portion of an integrated circuit pattern area of a mask substrate in the process of manufacturing a resist shading mask having the structure illustrated in FIG. 3D.

First, as illustrated in FIG. 8A, an organic film 2a having the property of absorbing or blocking off light, the resist film 2b having light-sensitivity, and the electroconductive film 9 are successively on the first principal plane of the mask substrate 1 in the same way as described above. The used organic film 2a may be, for example, an antireflection film made of a polyimide-based material. The resist film 2b is the same chemically-sensitizing electron beam resist as above.

Figure 8B:
FIG. 8B is a also a sectional views of a main portion of the integrated circuit pattern area of a mask substrate.
Figure 8C:
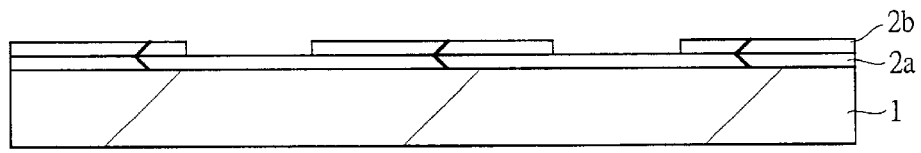
FIG. 8C is a further sectional views of a main portion of the integrated circuit pattern area of a mask substrate.
Figure 8D:
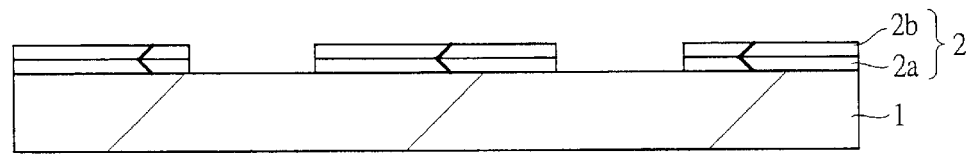
FIG. 8D is a still further sectional views of a main portion of the integrated circuit pattern area of a mask substrate.

Subsequently, an integrated circuit pattern is transferred onto the resist film 2b by drawing with an electron beam. In the same way as described above, the electroconductive film 9 is then removed as illustrated in FIG. 8B, and is baked. Thereafter, the mask substrate 1 is successively subjected to development and washing in the same way as described above, to form a resist pattern made of the resist film 2b as illustrated in FIG. 8C. The mask substrate 1 is subjected to baking treatment. Thereafter, the pattern of the resist film 2b is used as an etching mask to etch and remove the organic film 2a exposed from the mask, so as to pattern the organic film 2a as illustrated in FIG. 8D. This process permits production of the resist shading mask MR having the shading pattern 2 in which the resist film 2b is deposited on the organic film 2a. In the same way as described above, by exposing a wafer through the patterns of the resist shading mask MR and then comparison-examining the same circuit patterns, it is checked whether or not an abnormality is generated in the resist shading mask MR.

In the case of the shading pattern 2 of the resist shading mask MR having this structure, the organic film 2a has the property of blocking off or absorbing light for exposure even if the resist film 2b itself, which has light-sensitivity, does not have the property of blocking off or absorbing the light for exposure. Therefore, the shading pattern can be made to a pattern having the property of blocking off or absorbing the light for exposure. This makes it possible to supply the resist shading mask MR having the resist shading pattern having the property of blocking off light for exposure which has a wavelength of 200 nm or more, such as a KrF excimer laser (wavelength: 248 nm) or an i ray (wavelength: 365 nm).

For the resist shading mask MR having such a structure, the rotating processing of the mask substrate 1 is used in various steps. According to the present embodiment, by making the planar shape of the mask substrate 1 circular and chamfering the first principal plane more largely than the second principal plane in the circumferential end portion of the mask substrate 1, alien substances, for example, the residues of the resist film 2b adhering to the first and second principal planes of the mask substrate 1, can be reduced up to an insignificant extent or can be lost in the removal of the electroconductive film 9, the development of the resist film 2b, the subsequent washing and so on. In the same way as described above, various devices can commonly be used in the mask-producing line and the wafer-producing line. As a result, costs of masks and semiconductor integrated circuit devices can be reduced.

Figure 9:
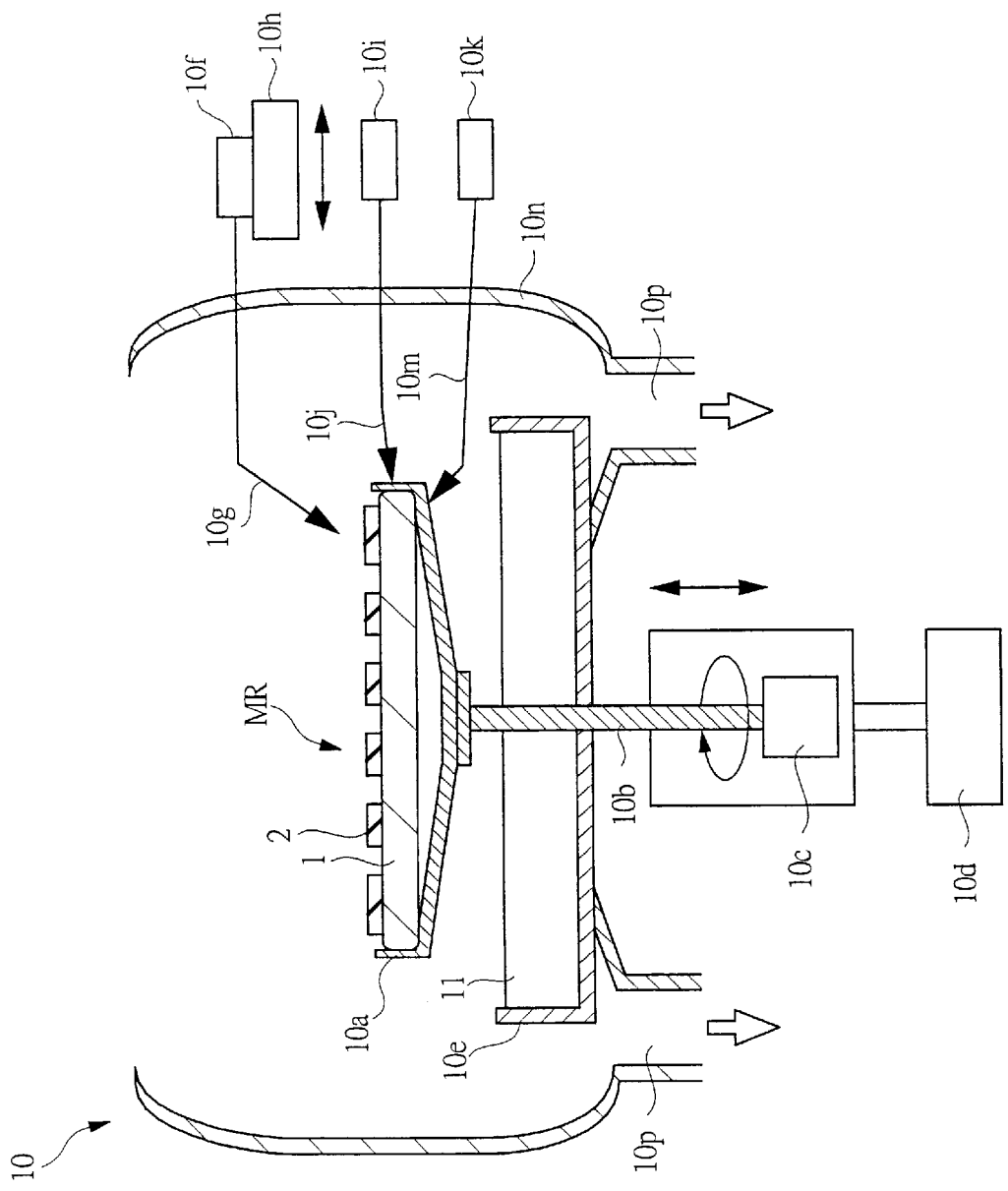
FIG. 9 is an explanatory view of an example of a mask developing/washing device used in an embodiment of the present invention.

FIG. 9 illustrates an example of a mask developing/washing device used to produce the resist shading mask MR.

The mask substrate 1 in a planar circular form is held on a rotary head 10a in the state that its principal plane (pattern-forming plane) is directed upward. This rotary head 10a is set to be rotatable inside the first and second principal planes of the mask substrate 1 through a rotary axis 10b jointed to the center of the back surface of the head 10a by means of a rotary driving unit 10c such as a motor. The rotary head 10a is set to be movable in the upper and lower directions of FIG. 9 by means of a driving unit 10d for up-and-down motion. A dip tank 10e is fixed between the rotary head 10a and the rotary driving unit 10c. A washing solution 11 as described above is stored in the dip tank 10e. At the time of washing, the rotary head 10a is descended by the driving unit 10d for up-and-down motion. By rotating the mask substrate 1 in the state that the mask substrate 1 is immersed in the washing solution 11, the surface of the mask substrate 1 can be washed. A developing solution and a rinse solution in a developing solution supplying unit 10f can be supplied through a movable nozzle 10g to the first principal plane of the mask substrate 1, and so on. The developing solution supplying unit 10f and the movable nozzle 10g can be moved by a nozzle position driving unit 10h. A washing solution in a washing solution supplying unit 10i can be supplied through an end face washing nozzle 10j to the circumferential end face of the mask substrate 1. A washing solution in a washing solution supplying unit 10k can be supplied through a back surface washing nozzle 10m to the second principal plane of the mask substrate 1. The outer circumference of this developing/washing mechanism unit is surrounded by a developing cup 10n. The developing solution and the washing solutions in the developing cup 10n are discharged through a waste fluid pipe 10p outside the present device.

At the time of development for forming the shading pattern 2 of the resist shading mask, the mask substrate 1 is rotated at a low speed in the state that the developing solution is dropped onto the center of the first principal plane of the mask substrate 1. In this way, the developing solution is moved and spread from the center of the mask substrate 1 to the periphery thereof. At this time, in order not to generate rebound of the developing solution, it is necessary to optimize conditions such as the cup-size of the developing cup 10n and displacement volume. According to the present embodiment, by making the mask substrate circular, the phenomenon that microscopic alien substances based on the rebound of the developing solution, the washing solutions and so on adhere to the peripheral portion of the mask substrate 1 can be reduced or lost. In removal of the electroconductive film 9 and washing thereof, the phenomenon that microscopic alien substances based on such rebound described as above adhere to the peripheral portion of the first and second principal surfaces of the mask substrate 1 can be reduced or lost, as well. By making the mask substrate 1 circular, the uniformity of the applied resist film can be improved.

Figure 10:
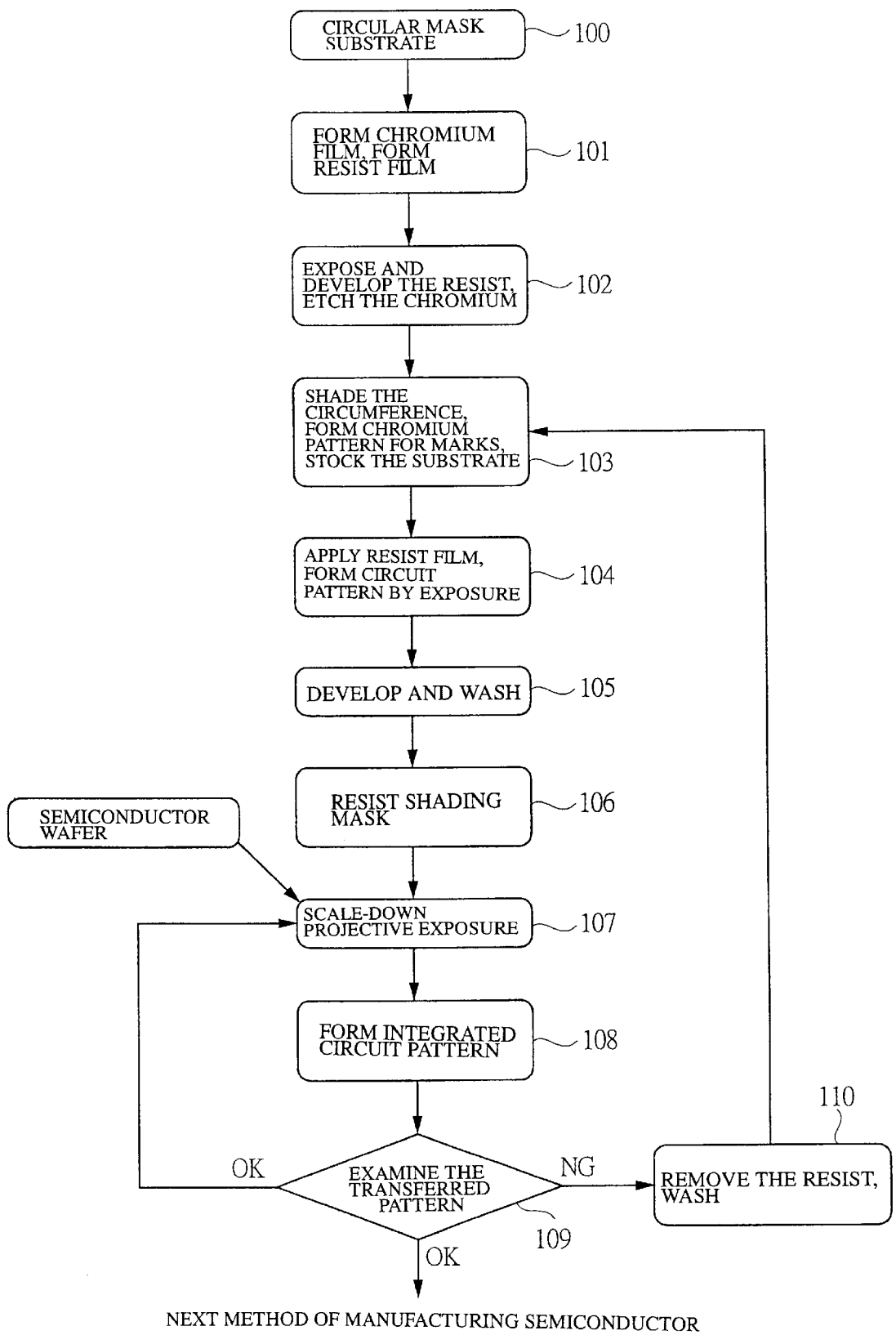
FIG. 10 is a flowchart of the process of manufacturing a semiconductor integrated circuit device, which is an embodiment.

The following will describe a case in which the present invention is applied, for example, to a method of manufacturing a semiconductor integrated circuit device. FIG. 10 is a flowchart of the process.

As shown in FIG. 10, a mask substrate having a planar circular shape is first prepared (step 100) in practice. Thereafter, a metal film made of chromium or the like is deposited on the principal plane thereof, and then an electron beam sensitive resist film is applied onto the metal film (step 101). Subsequently, the resist film is subjected to exposure to an electron beam, development, etching, and so on, so as to form a peripheral shading zone (corresponding to the shading pattern 3), marks for scale-down projective exposure (corresponding to the alignment marks 4 and the marks 5), and the like on the first principal plane of the mask substrate 1 (steps 102 and 103). The steps up to here are the same as in the method of manufacturing the ordinary mask. The mask substrate 1 at this stage can be stocked as a common mask, that is, the so-called blanks.

Next, the electron beam sensitive resist film is applied onto the first principal plane of the mask substrate 1, and then an integrated circuit pattern is drawn on the electron beam sensitive resist film by electron beam drawing (i.e., exposure to an electron beam) (step 104). Subsequently, the mask substrate 1 is developed and washed to form the resist shading mask MR (steps 105 and 106).

Figure 11A:
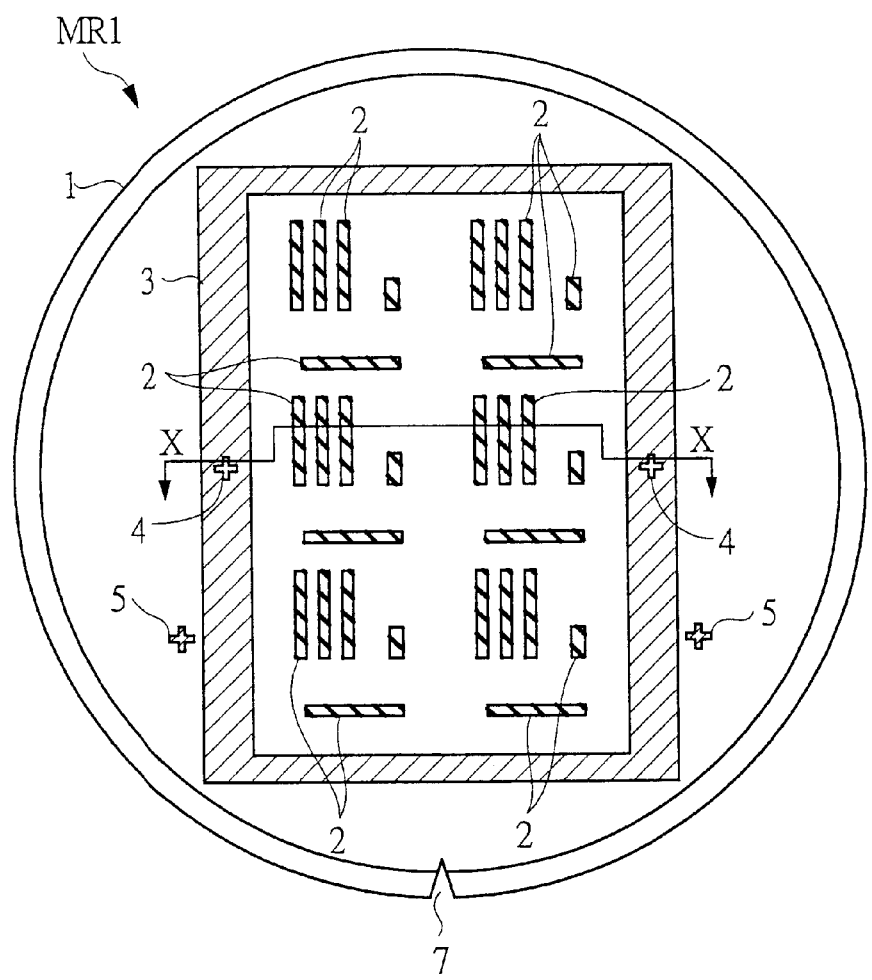
FIG. 11A is a plan view of the whole of an example of a resist shading mask used in the process of manufacturing the semiconductor integrated circuit device, which is an embodiment of the present invention.
Figure 11B:
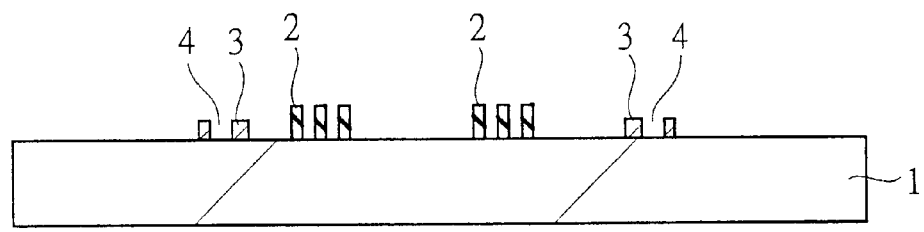
FIG. 11B is a sectional view taken along X—X line of FIG. 11A.
Figure 12A:
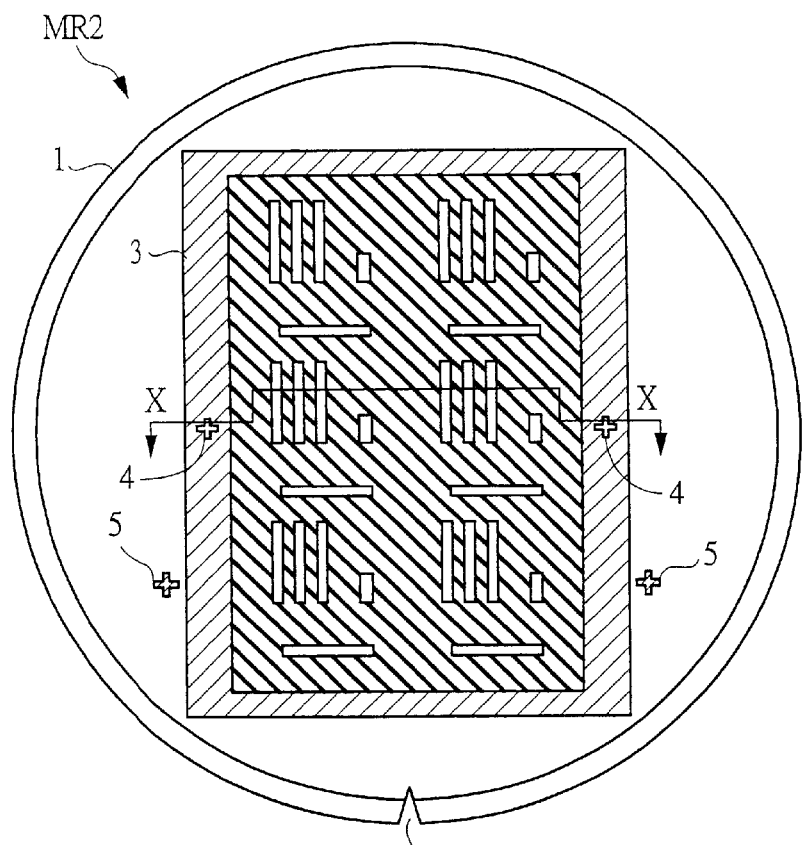
FIG. 12A is a plan view of the whole of another example of the resist shading mask used in the process of manufacturing the semiconductor integrated circuit device, which is an embodiment of the present invention.
Figure 12B:
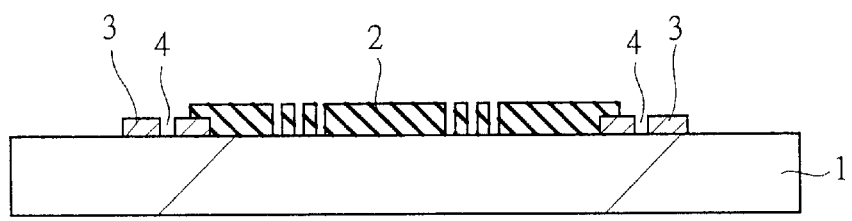
FIG. 12B is a sectional view taken along X—X line of FIG. 12A.
Figure 13A:
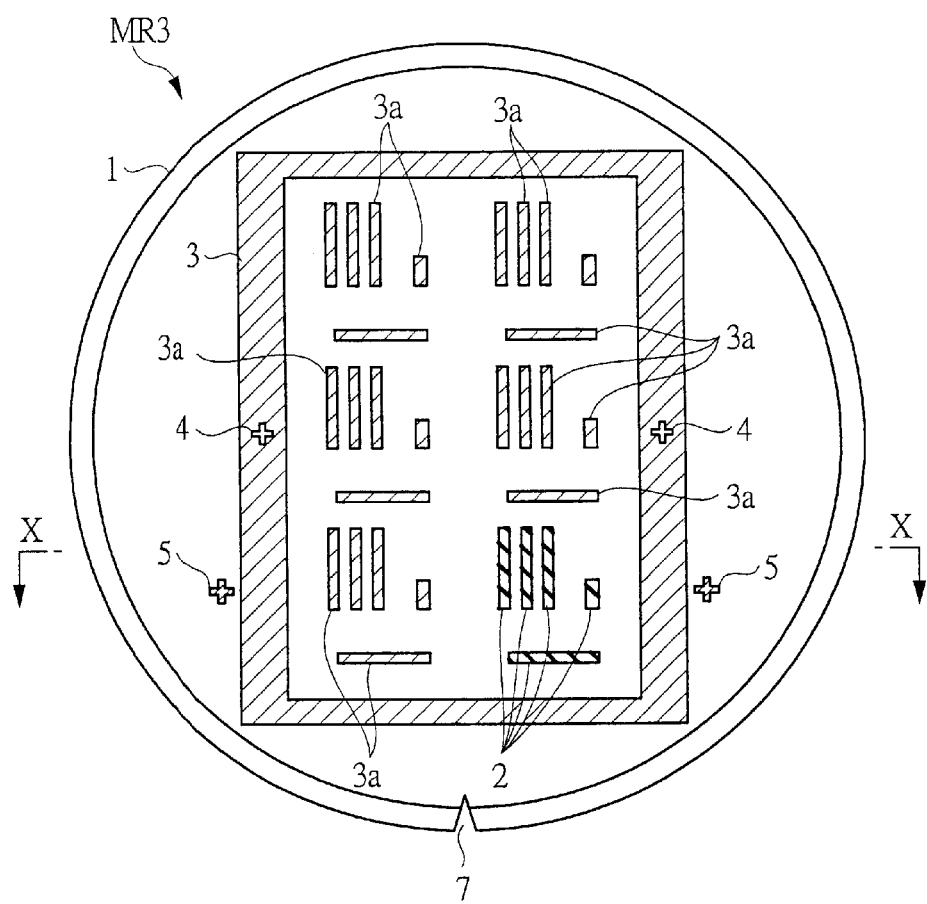
FIG. 13A is a plan view of the whole of a further example of the resist shading mask used in the process of manufacturing the semiconductor integrated circuit device, which is an embodiment of the present invention.
Figure 13B:
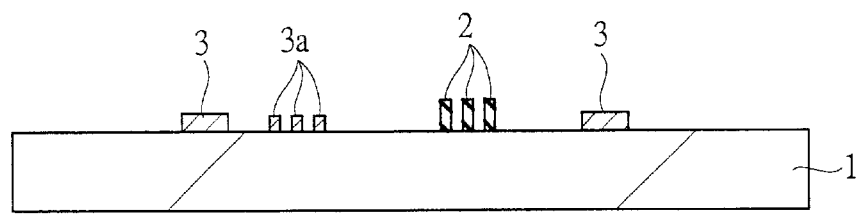
FIG. 13B is a sectional view taken along X—X line of FIG. 13A.

FIGS. 11 to 13 illustrate examples (MR1 to MR3) of the resist shading mask MR. Each of FIGS. 11A to 13A is a plan view of the whole of each of the resist shading masks MR1 to MR3. Each of FIGS. 11B to 13B is a sectional view taken along X—X line of each of FIGS. 11A to 13A. The resist shading masks MR1 to MR3 are reticles for forming an image of an original of an integrated circuit pattern whose size is, for example, 1–10 times larger than the actual size on a wafer through a scale-down projection optical system and so on and then transferring this image. The exemplified MR1 to MR3 are resist shading masks for transferring a wiring pattern and so on. Even if any one of the resist shading masks MR1 to MR3 is used, the wiring pattern having the same shape is transferred. Each of the resist shading masks MR1 and MR2 exemplified in FIGS. 11 and 12 has a structure in which all of patterns in an integrated circuit pattern area are formed of a shading pattern 2 of a resist film. In FIG. 11, the shading pattern 2 is transferred onto a wafer, and in FIG. 12, a light-transmissible pattern 2 not covered with the shading pattern 2 is transferred onto a wafer. The resist shading mask MR3 exemplified in FIG. 13 has a structure in which a pattern formed in an integrated circuit pattern area is composed of both a shading pattern 3a made of a metal film and a shading pattern 2 made of a resist film. That is, the shading pattern 2 made of the resist film is partially arranged. This makes it possible to supply the resist shading mask MR3 which can be partially corrected. The shading pattern 3a is formed by processing the same metal film as constituting the shading pattern 3 at the same time of forming the shading pattern 3. In all the cases, a mask can easily be produced at low costs in a short time since the shading pattern 2 is formed of the resist film. Particularly in the process of manufacturing a variety of low-produced articles, such as an application specific IC (ASIC), the process of manufacturing mask ROMs or at the stage of developing or examining semiconductor integrated circuit devices, the shape and the size of their pattern are unstable. As a result, modification is frequently made. Therefore, application of the present invention is very effective for shortening the period for producing the semiconductor integrated circuit devices or reduce the costs thereof. In the case of a resist shading mask, a metal film such as a chromium film is not etched when a mask pattern for an integrated circuit pattern is formed. Thus, an error based on such etching is not generated. The dimensional accuracy of the transferred pattern can be improved accordingly.

Next, such a resist shading mask MR is used to subject a wafer to scale-down projective exposure (step 107). At this time, as described above, the shading pattern 3 made of the metal film is arranged around the integrated circuit pattern area of the first principal plane of the mask substrate 1 and the pattern 3 is partially removed. In this way, the alignment marks 4 are formed. As a result, even if the wavelength of alignment light is longer than that of light for exposure, the detection accuracy of the positions of the resist shading mask, the exposure device and the wafer can be satisfactorily obtained. Thus, good positioning between them can be attained.

Subsequently, development, washing and baking treatments are conducted to transfer the given integrated circuit pattern onto the resist film on the wafer (step 108). In the present embodiment, by making the diameter of the mask substrate 1 equal to or slightly smaller than that of the wafer as described above, the developing/washing device used to develop and wash the mask substrate 1 can be used at the time of the development and washing for transferring the integrated circuit pattern onto the wafer. In short, a production device can commonly be used in the mask-producing line and the wafer-producing-line. Accordingly, costs of masks and semiconductor integrated circuit devices can be reduced.

Figure 14A:
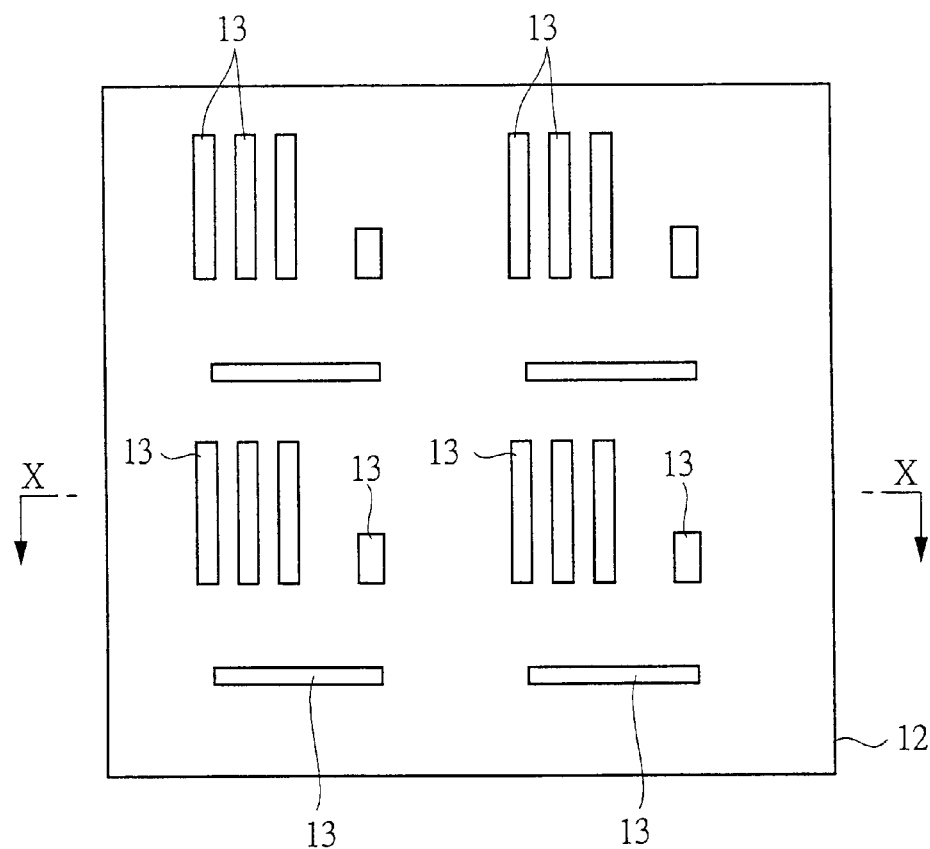
FIG. 14A is a plan view of a main portion of a semiconductor wafer, and illustrates a resist pattern transferred onto the semiconductor wafer by using the resist shading mask illustrated in FIG. 12 or 13.
Figure 14B:
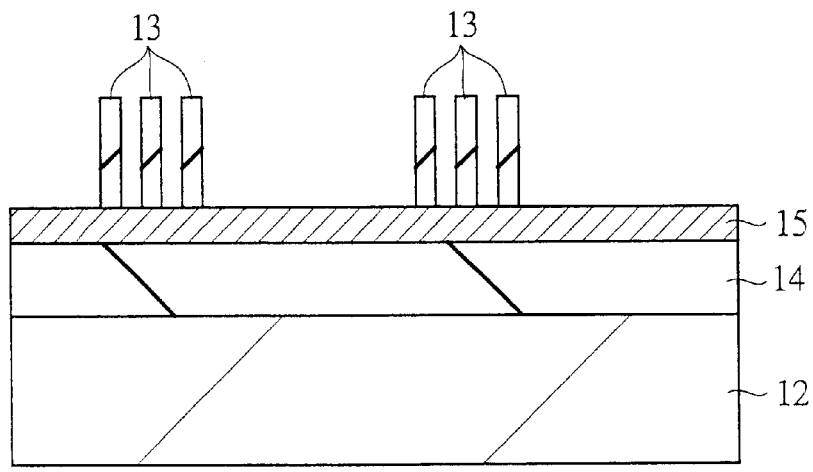
FIG. 14B is a sectional view taken along X—X line of FIG. 14A.

FIGS. 14A and 14B illustrate a resist pattern 13 transferred onto a wafer 12 by scale-down exposure treatment using any one of the resist shading masks MR1–MR3 illustrated in FIGS. 12 to 13. FIG. 14A is a plan view of a main portion of the wafer 12, and FIG. 14B is a sectional view taken along X—X line of FIG. 14A. The wafer 12 is made of, for example, silicon monocrystal. An insulator film 14 made of silicon oxide or the like is deposited on a principal plane (element-forming plane) thereof, and further an electroconductive film 15 made of aluminum, tungsten or the like is deposited thereon. In the case that the resist shading masks MR1 and MR3 illustrated in FIGS. 11 and 13 are used, a positive resist is used as the material of the resist pattern 13. In the case that the resist shading mask MR2 illustrated in FIG. 12 is used, a negative resist is used as the material of the resist pattern 13.

Subsequently, the transferred pattern (resist pattern 13a) on the wafer 12 is examined. Circuit patterns equivalent to each other in design are arranged in different unit areas in the resist shading mask MR, as described above. When the resist shading mask MR is examined, the resist shading mask MR itself is not subjected to an appearance examination as performed for ordinary masks, but is subjected to a comparison-examination wherein the circuit patterns made equivalent to each other in design, in the different unit areas in the wafer 12, are compared with each other. About the resist pattern 13 on the wafer 12, the size of the resist pattern in a given spot is measured with a length-measuring scanning electron microscope (SEM) (step 109).

In the case that a different is generated in the circuit patterns or the given size cannot be obtained by these examinations, the shading pattern 2 of the resist film on the resist shading mask MR is removed and the mask substrate is subjected to washing and so on. Thereafter, a new shading pattern 2 made of the organic material is again formed (step 110). As described above, by examining the resist pattern 13 actually transferred onto the wafer 12 in the process of manufacturing a semiconductor integrated circuit device in the present embodiment, it is decided whether the corresponding resist shading mask MR is used or not. In this way, mask costs can be reduced. The resist shading mask MR, the use of which comes to an end in the given step (exposure step) in the process of manufacturing the semiconductor integrated circuit device, is subjected to reproducing treatment. In this way, the mask substrate 1 itself can be used many times. Therefore, a mask-producing period can be made short, and mask-producing costs can be reduced.
(Embodiment 2)

Referring to FIGS. 15 to 22, the following will describe, as the present embodiment, a resist shading mask technique in which a phase shift means is set to a mask substrate having a planar circular shape as described above.

Figure 15:
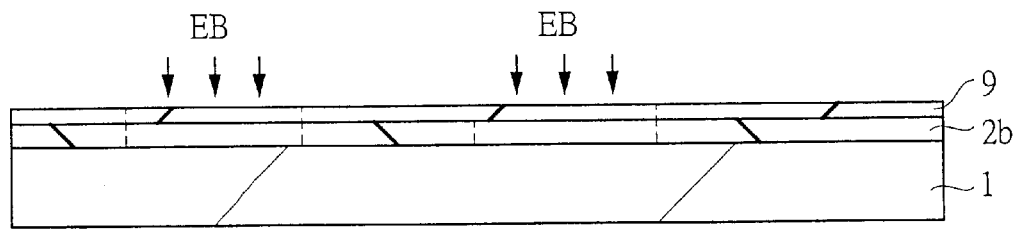
FIG. 15 is a sectional view of a main portion of a mask substrate in the process of manufacturing a resist shading mask, which is a further embodiment.

Firstly, as illustrated in FIG. 15, by rotation coating, a resist film 2b and an electroconductive film 9 are successively applied onto the first principal plane of a mask substrate 1 having a planar circuit shape in the same way as in the embodiment 1. Electron beams EB are selectively radiated onto phase shifter forming areas in the resist film 2b.

Figure 16:
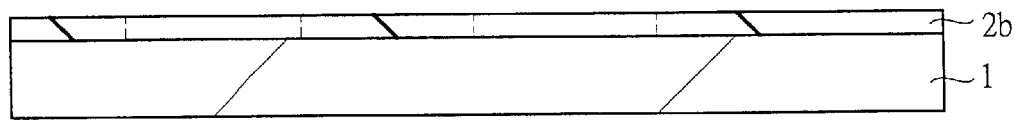
FIG. 16 is a sectional view of the main portion of the mask substrate subsequent to the step illustrated in FIG. 15.
Figure 17:
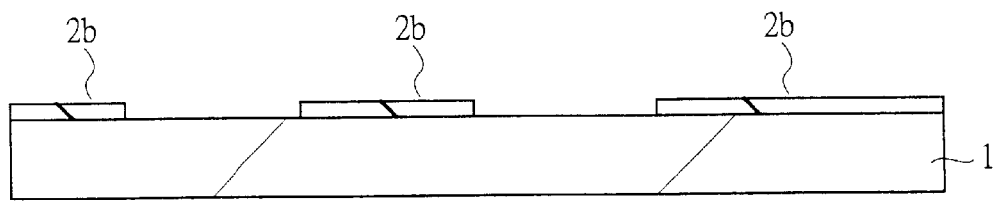
FIG. 17 is a sectional view of the main portion of the mask substrate subsequent to the step illustrated in FIG. 16.

Subsequently, as illustrated in FIG. 16, the electroconductive film 9 is removed in the same way as in the embodiment 1. Thereafter, the mask substrate is subjected to baking treatment, and then developed in the same way as in the embodiment 1. The developed mask substrate is then subjected to baking treatment to pattern the resist film 2b as illustrated in FIG. 17.

Figure 18:
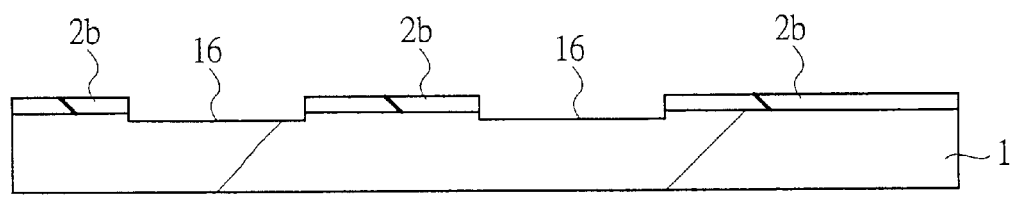
FIG. 18 is a sectional view of the main portion of the mask substrate subsequent to the step illustrated in FIG. 17.
Figure 19:
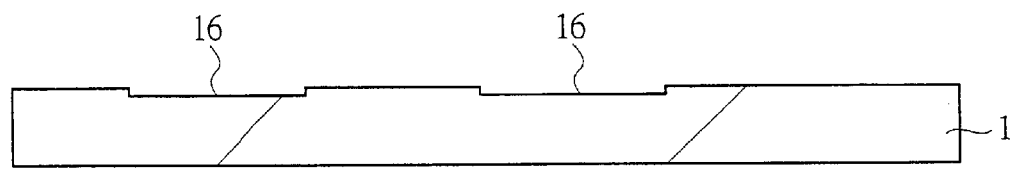
FIG. 19 is a sectional view of the main portion of the mask substrate subsequent to the step illustrated in FIG. 18.

Next, using the pattern of the resist film 2b as an etching mask, the first principal plane of the mask substrate 1 not covered with the mask is etched and removed by a given depth as shown in FIG. 18. Thus, a phase shift pattern 16 is formed in the first principal plane of the mask substrate 1. The groove depth of the phase sift pattern 16, that is, the digging depth of the mask substrate 1 is made to cause two phase (i.e., the phases of respective light beams for exposure which transmit through areas where the phase shift pattern 16 is formed and areas where the phase shift pattern 16 is not formed) to be reversed by 180°. The digging depth of the mask substrate 1 is, for example, about 190 nm in the case of, for example, exposure to an ArF laser. Subsequently, the pattern of the resist film 2b is removed as illustrated in FIG. 19, and then washing treatment and an examination are performed. In this washing treatment, for example, ozone sulfuric acid is used.

Figure 20:
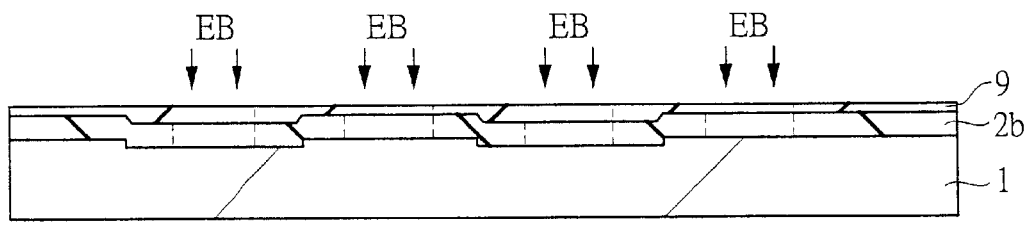
FIG. 20 is a sectional view of the main portion of the mask substrate subsequent to the step illustrated in FIG. 19.
Figure 21:
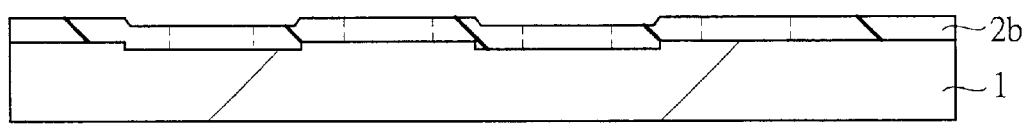
FIG. 21 is a sectional view of the main portion of the mask substrate subsequent to the step illustrated in FIG. 20.
Figure 22:
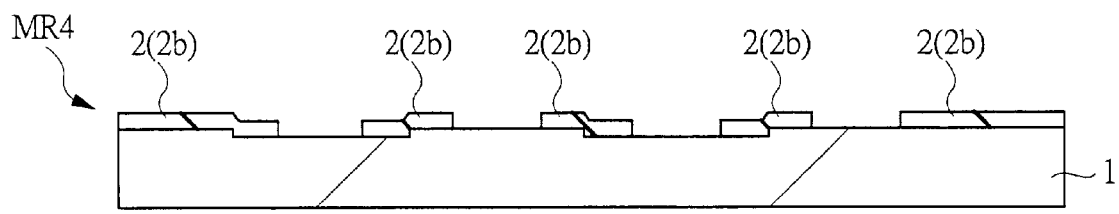
FIG. 22 is a sectional view of the main portion of the mask substrate subsequent to the step illustrated in FIG. 21.

Next, the mask substrate 1 is subjected to surface-treatment with HMDS. Thereafter, as illustrated in FIG. 20, a resist film 2b and an electroconductive film 9 are successively applied onto the first principal plane of the mask substrate 1 in the same way as described above. Subsequently, electron beams EB are selectively radiated onto light-transmissible areas in the resist film 2b in order to transfer an integrated circuit pattern onto the resist film 2b. As illustrated in FIG. 21, the electroconductive film 9 is then removed in the same way as described above. The mask substrate 1 is subjected to baking treatment. Thereafter, the mask substrate 1 is developed, washed and baked, and is then subjected to light ashing to form a shading pattern 2 formed of the resist film 2b as illustrated in FIG. 22. In this way, a resist shading mask MR4 having the phase shift pattern 16 is produced. In the same way as described above, it is checked by comparison examination of circuit patterns transferred on a wafer whether or not an abnormality is generated in the thus-produced resist shading mask MR4.

In the present embodiment, by making the planar shape of the mask substrate 1 circular and chamfering the first principal plane more largely than the second principal plane in the circumferential end portion of the mask substrate 1 in the resist shading mask MR4 having the phase shift means, alien substances, for example, the residues of the resist film R adhering to the first and second principal planes of the mask substrate 1, can be reduced up to an insignificant extent or can be lost.

(Embodiment 3)

Referring to FIGS. 23 to 30, the following will describe, as the present embodiment, a resist shading mask technique in which a halftone phase shifter is set to a mask substrate having a planar circular shape as described above.

Figure 23:
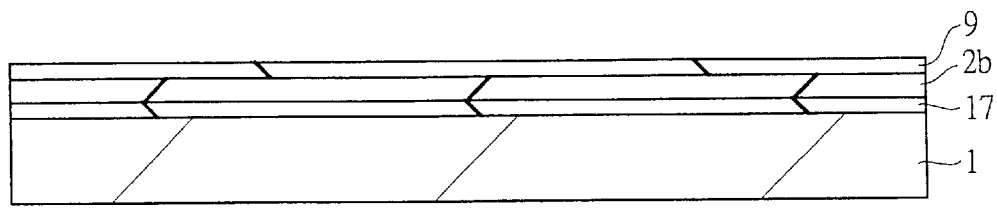
FIG. 23 is a sectional view of a main portion of a mask substrate in the process of manufacturing a resist shading mask, which is a still further embodiment.

Firstly, as illustrated in FIG. 23, a halftone film 17 is deposited on the first principal plane of a mask substrate 1 having the same planar circular shape as in the embodiment 1, and then by rotation coating, a resist film 2b and an electroconductive film 9 are successively applied onto the halftone film 17 in the same way as described above. The used halftone film 17 may be, for example, a semitransparent film whose transmissivity of light for exposure is, for example, about 4 to 15%, and is made of a material causing light transmitting through opening areas and light transmitting through the halftone film 17 to be reversed by 180°.

Figure 24:
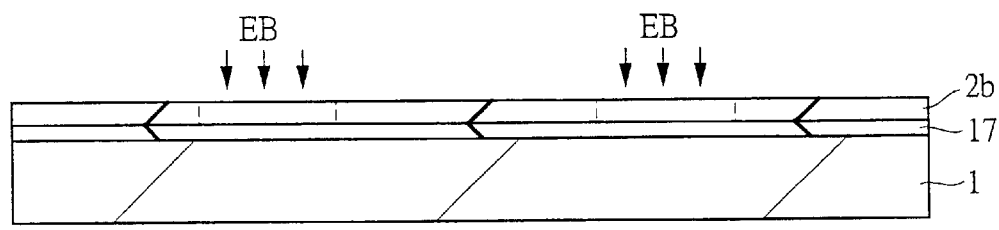
FIG. 24 is a sectional view of the main portion of the mask substrate subsequent to the step illustrated in FIG. 23.
Figure 25:
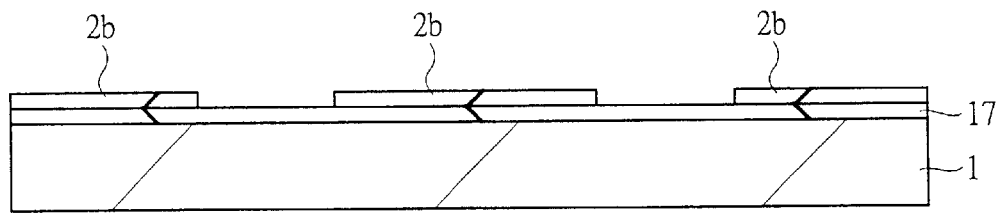
FIG. 25 is a sectional view of the main portion of the mask substrate subsequent to the step illustrated in FIG. 24.

Subsequently, as illustrated in FIG. 24, electron beams EB are selectively radiated onto the opening areas in the resist film 2b. Subsequently, the electroconductive film 9 is removed in the same way as described above, and the mask substrate is subjected to baking treatment. Thereafter, the mask substrate is subjected to development and baking treatment in the same way as described, so as to pattern the resist pattern 2b as illustrated in FIG. 25.

Figure 26:
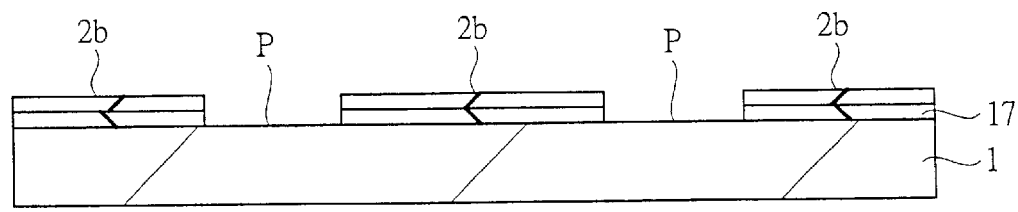
FIG. 26 is a sectional view of the main portion of the mask substrate subsequent to the step illustrated in FIG. 25.
Figure 27:
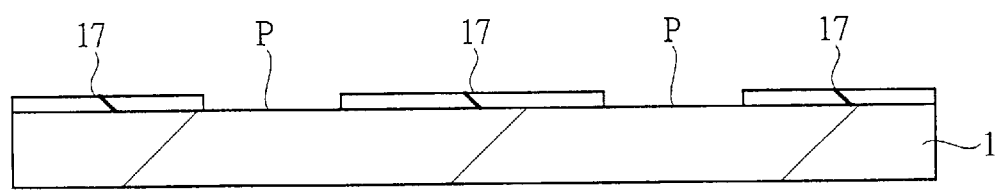
FIG. 27 is a sectional view of the main portion of the mask substrate subsequent to the step illustrated in FIG. 26.

Next, using the pattern of the resist film 2b as an etching mask, portions of the halftone film 17 not covered with the mask are etched and removed as illustrated in FIG. 26, to form opening portions P, in which parts of the first principal plane of the mask substrate 1 are exposed. In the case that a hole pattern such as contact holes or through holes is transferred, the planar shape of the opening portions P is made, for example, rectangular. Subsequently, the pattern of the resist film 2b is removed as illustrated in FIG. 27, and then washing and an examination are performed.

Figure 28:
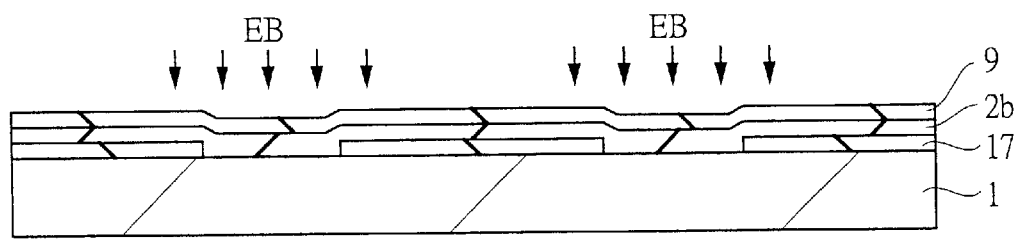
FIG. 28 is a sectional view of the main portion of the mask substrate subsequent to the step illustrated in FIG. 27.
Figure 29:
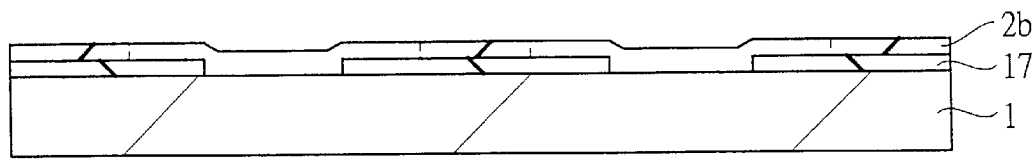
FIG. 29 is a sectional view of the main portion of the mask substrate subsequent to the step illustrated in FIG. 28.
Figure 30:
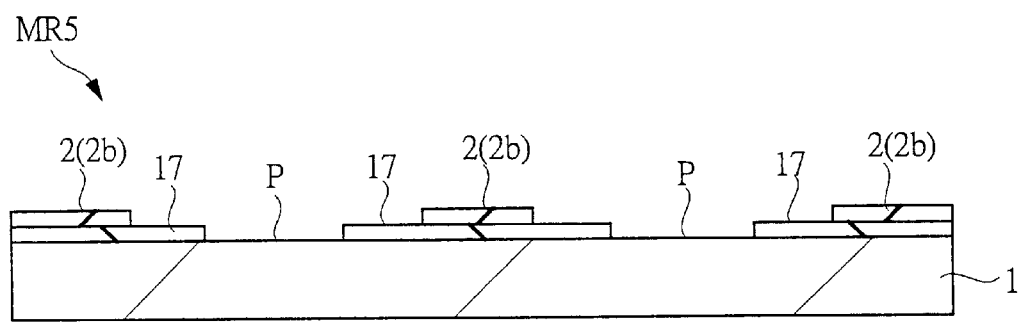
FIG. 30 is a sectional view of the main portion of the mask substrate subsequent to the step illustrated in FIG. 29.

Next, as illustrated in FIG. 28, a resist film 2b and an electroconductive film 9 are successively applied onto the first principal plane of the mask substrate 1 in the same way as described above. Subsequently, electron beams EB are selectively radiated onto light-transmissible areas in the resist film 2b in order to transfer an integrated circuit pattern onto the resist film 2b. As illustrated in FIG. 29, the electroconductive film 9 is then removed in the same way as described above. The mask substrate 1 is subjected to baking treatment. Thereafter, the mask substrate 1 is developed, washed and baked, and is then subjected to light ashing to form a shading pattern 2 formed of the resist film 2b as illustrated in FIG. 30. In this way, a resist shading mask MR5 having the halftone film 17 is produced. In the same way as described above, it is checked by comparison examination of circuit patterns transferred on a wafer whether or not an abnormality is generated in the thus-produced resist shading mask MR5.

In the present embodiment, by making the planar shape of the mask substrate 1 circular and chamfering the first principal plane more largely than the second principal plane in the circumferential end portion of the mask substrate 1 in the resist shading mask MR5 having the halftone film 17, alien substances, for example, the residues of the resist film R adhering to the first and second principal planes of the mask substrate 1, can be reduced up to an insignificant extent or can be lost.

(Embodiment 4)

Figure 31:
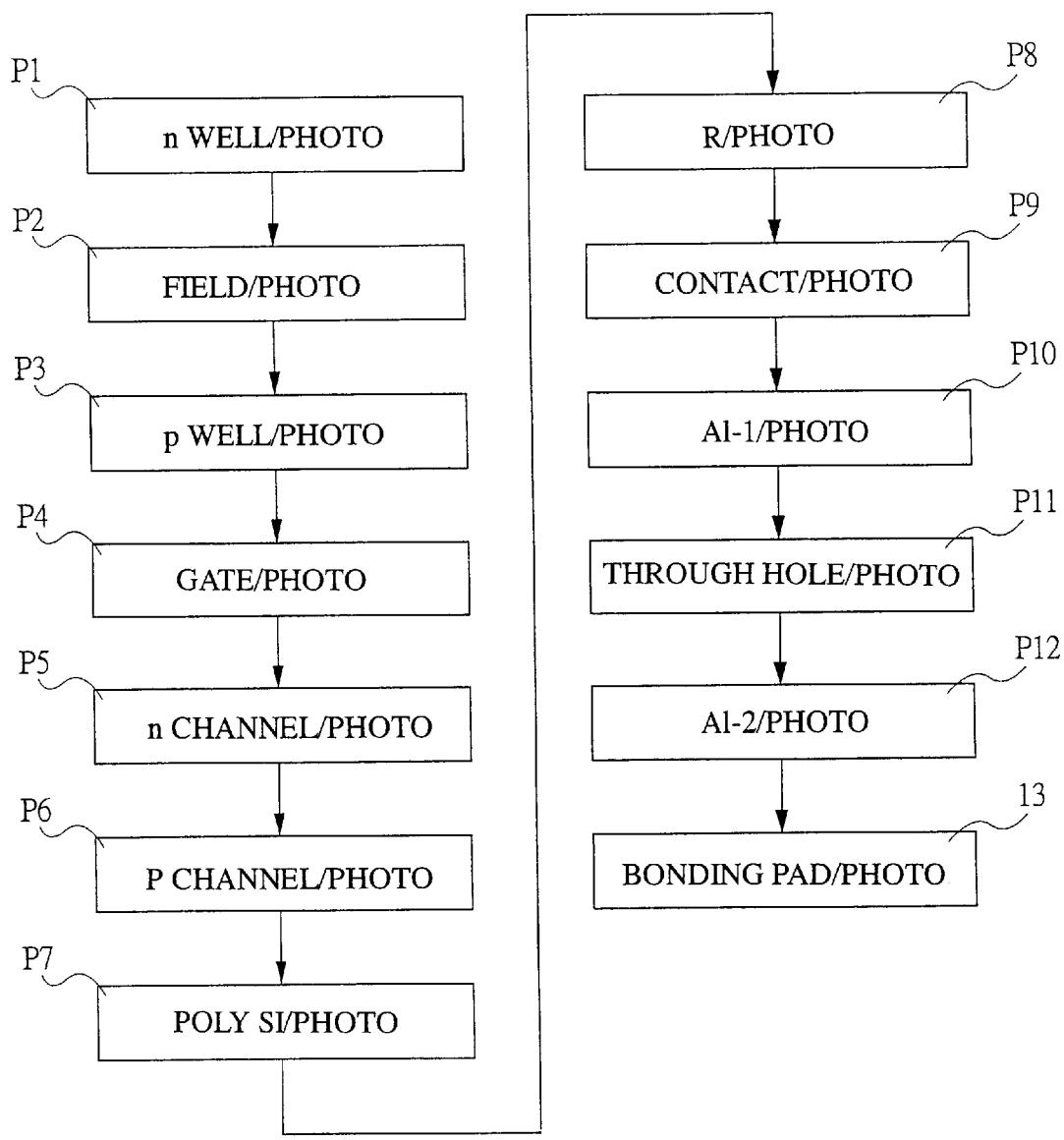
FIG. 31 is a flowchart showing a specific example of the process of manufacturing a semiconductor integrated circuit device, which is an additional embodiment of the present invention.

Referring to FIGS. 32 to 35, along steps shown in FIG. 31, the following will describe, as the present embodiment, a case in which the present invention is applied to a process of manufacturing a semiconductor integrated circuit device having a complementary IIS (CMIS) circuit. FIGS. 32 to 35 are sectional views of a main portion of a wafer during the process of manufacturing the semiconductor integrated circuit device.

Figure 32:
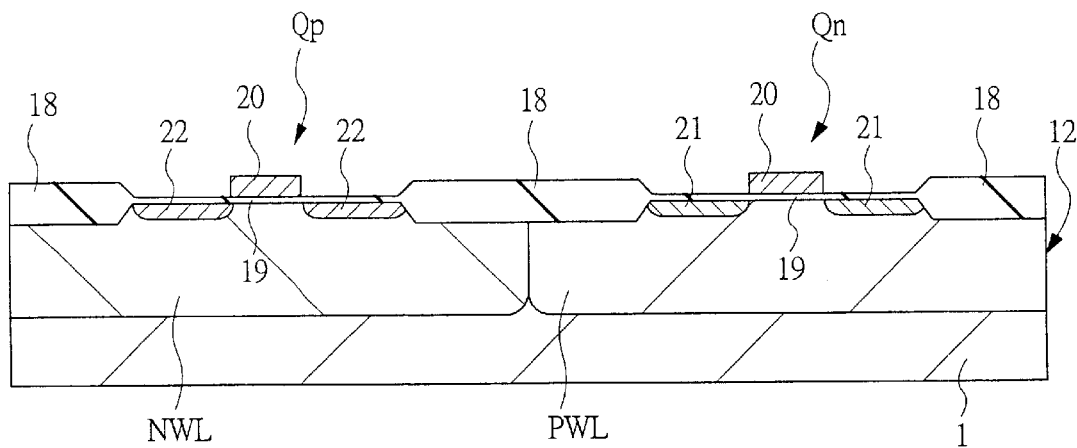
FIG. 32 is a sectional view of the main portion of a semiconductor substrate in the process of manufacturing the semiconductor integrated circuit device illustrated in FIG. 31.

First, steps until a sectional structure illustrated in FIG. 32 is obtained will be described. An n well/photo step P1 is a step of depositing an insulator film such as a silicon nitride film on a semiconductor substrate made of, for example, an n-type silicon monocrystal constituting a wafer 12, and then forming a photo resist pattern for covering regions other than n-well forming regions on the insulator film. For example, phosphorous or arsenic is introduced into n wells NWL of the wafer 12.

A p well/photo step is a step of forming a photo resist pattern for covering the n wells NWL in order to form channel stopper regions of p wells PWL. For example, boron is introduced into the p wells PWL.

A field/photo step P3 is a step of depositing an insulator film such as a silicon nitride film on the principal plane of the wafer 12, and then forming a photo resist pattern for covering only element-forming regions on the insulator film. A field insulator film 18 made of, for example, silicon oxide is formed on the principal plane of the wafer 12 by local oxidization of silicon (LOCOS), and subsequently a gate insulator film 19 made of, for example, silicon oxide is formed, by thermal oxidization, in the element-forming regions surrounded by the field insulator film 18. The isolation portions may be a trench type isolation structure (trench isolation) instead of the field insulator film 18. In this case, circuits can be made fine and highly integrated.

A gate/photo step P4 is a step of depositing an electroconductive film made of polysilicon or the like on the principal plane of the wafer 12, and then forming a photo resist pattern for covering a gate electrode forming region on the electroconductive film. A gate forming film made of low-resistance polysilicon is deposited by CVD or the like, and then the film is patterned by photolithographic technique and etching technique, to form gate electrodes 20.

An n channel/photo step P5 is a step of forming a photo resist pattern for covering the pMIS forming region in order to ion-implant phosphorous, arsenic or the like onto the nMIS forming region through the gate electrodes 20 as masks. For example, phosphorus or the arsenic is, in self-alignment, introduced into the nMIS forming region through the gate electrodes 20 as masks by ion-implantation or the like.

Contrarily, a p channel/photo step P6 is a step of forming a photo resist pattern for covering the nMIS forming region in order to ion-implant boron or the like onto the pMIS forming region through the gate electrodes 20 as masks. For example, boron is, in self-alignment, introduced into the nMIS forming region through the gate electrodes 20 as masks by ion-implantation or the like.

Thereafter, the wafer 12 is subjected to thermal treatment to form n type semiconductor regions 21 which constitute source and drain regions of an nMIS Qn and form p type semiconductor regions 22 which constitute source and drain regions of a pMIS Qp.

Figure 33:
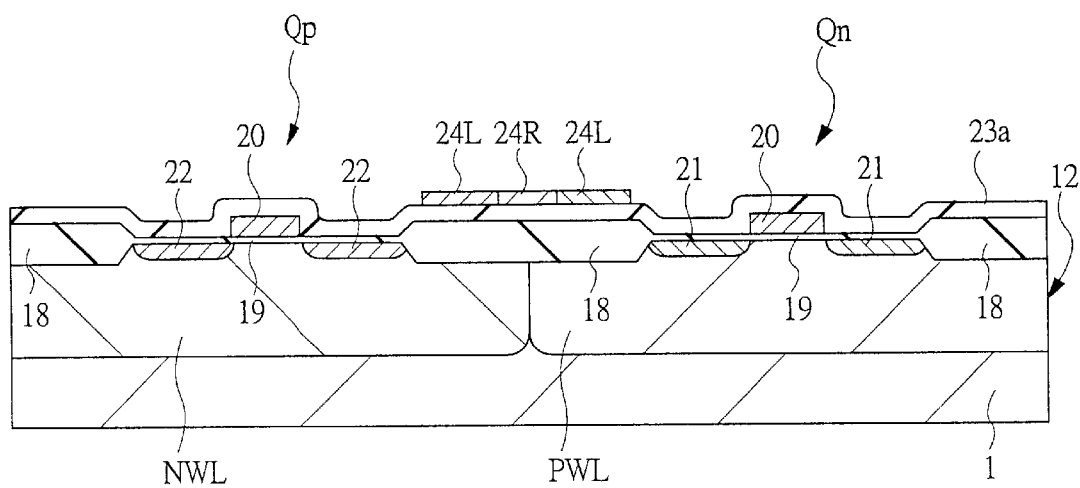
FIG. 33 is a sectional view of the main portion of the semiconductor substrate in the process of manufacturing the semiconductor integrated circuit device subsequent to FIG. 32.

Next, steps until a sectional structure illustrated in FIG. 33 is obtained will be described. A polycrystal silicon/photo step p7 is a step of forming a photo resist pattern for covering wiring and resistance regions on the polycrystal silicon film deposited on the principal plane of the wafer 12 in order to pattern a second polycrystal silicon film which will be wiring or resistances. An interlayer dielectric 23a made of, for example, a silicon oxide film is deposited on the principal plane of the wafer 12 by CVD or the like, and then a polysilicon film is deposited thereon by CVD or the like.

An R/photo step P8 is a step of using a negative process to pattern a photo resist pattern used as a mask when, in the state that the photo resist pattern is formed on the resistances, impurities are introduced into the other regions. The polysilicon film is patterned by lithographic technique and etching technique, and then impurities are introduced into given regions of the patterned polysilicon film. In this way, wiring 24L and resistances 24R formed of the polysilicon film are formed.

Figure 34:
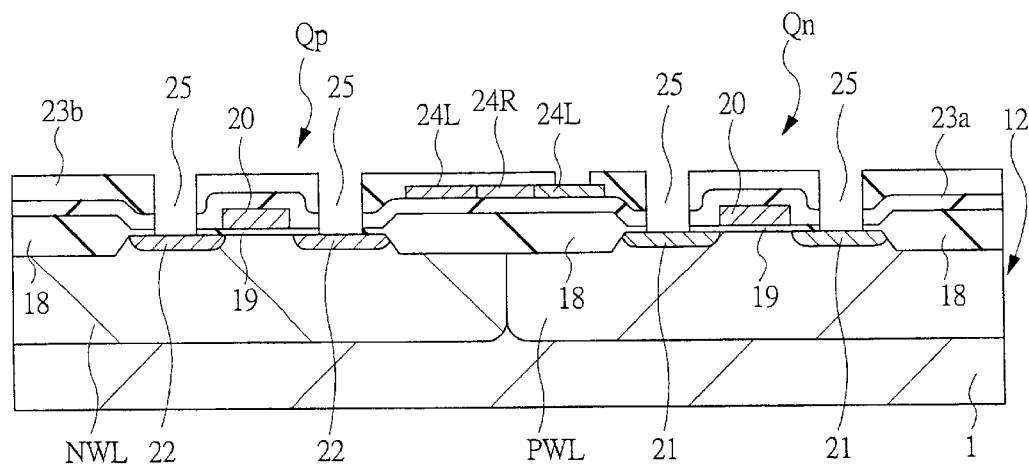
FIG. 34 is a sectional view of the main portion of the semiconductor substrate in the process of manufacturing the semiconductor integrated circuit device subsequent to FIG. 33.

Next, steps until a sectional structure illustrated in FIG. 34 is obtained will be described. A contact/photo step P9 is a step of depositing an interlayer dielectric 23b (spin-on-glass (SOG) film), such as a silicon oxide film, on the principal plane of the wafer 12 by rotation coating or the like, and then forming a photo resist pattern for forming contact holes 23 by a positive process. Contact holes 25, from which the semiconductor regions 21 and 20 and the wiring 24L are partially exposed, are made in the interlayer dielectric 23b by lithographic technique and etching technique. After this step, a metal film made of, for example, tungsten is deposited on the principal plane of the wafer 12 by sputtering or the like method. Thereafter, the metal film is polished by chemically polishing etching technique until the metal film except the metal film in the contact holes 25 is removed. In this way, the metal film may be embedded in the contact holes 25.

Figure 35:
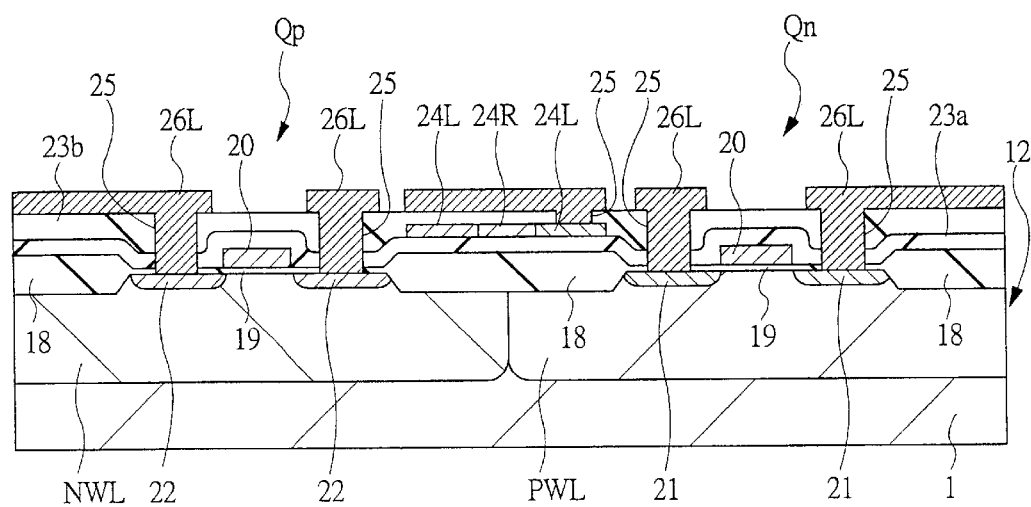
FIG. 35 is a sectional view of the main portion of the semiconductor substrate in the process of manufacturing the semiconductor integrated circuit device subsequent to FIG. 34.

Next, steps until a sectional structure illustrated in FIG. 35 is obtained will be described. An Al-1/photo step P10 is a step of depositing a metal film made of Al, Al alloy or the like on the principal plane of the wafer 12 by sputtering or the like, and then patterning this metal film as a first wiring layer 26L.

A through hole/photo step P11 is a step of forming a photo resist pattern for making through holes for connecting the first wiring layer and a second wiring layer. An interlayer dielectric made of, for example, an silicon oxide is deposited on the principal plane of the wafer 12 by CVD or the like, and then through holes are made in parts of the interlayer dielectric in the manner that parts of the first wiring layer 26L are exposed.

An Al-2/photo step P12 is a step of depositing a metal film made of, for example, Al or Al alloy on the principal plane of the wafer 12 by sputtering or the like, and then patterning this metal film as a second wiring layer.

A bonding pad/photo step P13 is a step of making openings having a diameter of about 100 $\mu$m and corresponding to bonding pads in a surface protective film, and is a step of forming, on the surface protective film, a photo resist pattern for covering other than bonding pad forming regions. Thereafter, the surface protective film made of, for example, oxide silicon is deposited on the principal plane of the wafer 12 by CVD or the like, so as to cover the second wiring layer.

In the n well/photo step P1, the n channel/photo step P5, the P channel/photo step P6 and the bonding pad/photo step P13, among these exposure steps, the minimum size is relatively large. Therefore, the exposure is performed using, for example, the resist shading mask MR illustrated in FIG. 3.

In the gate/photo step P4, for example, the resist shading mask MR4 having the phase shift means, illustrated in FIG. 22, is used to form the gate electrodes 20. At this time, as the resist film for patterning the gate electrodes 20, for example, chemically-sensitizing type negative photo resist is used.

In the contact/photo step P9, for example, the resist shading mask MR5 having the halftone film, illustrated in FIG. 30, is used to form the contact holes 25. At this time, as the resist film for patterning the contact holes 25, for example, chemically-sensitizing type positive photo resist is used.

When a given kind of semiconductor integrated circuit device is produced, an ordinary mask and a resist shading mask MR may be used together. In this case, the mask substrate of the ordinary mask may have a planar rectangular shape, but may have a circular shape in the same manner as the mask substrate 1 of the resist shading mask MR. By making the mask substrate of the ordinary mask circular, the ordinary mask can be handled in the same manner as the resist shading mask MR. Therefore, in the case that the two masks are used together, the mask-producing-line and the wafer-producing-line can be made simple. As a result, the period for producing masks and the period for producing semiconductor integrated circuit devices can be made shorter. Furthermore, costs of masks and semiconductor integrated circuit devices can be reduced.

About such a resist shading mask MR, its mask pattern can easily be changed. Therefore, by using the resist shading mask MR at the stage of developing semiconductor integrated circuit devices or the like stage, the period for developing the semiconductor integrated circuit devices can be made short and mask costs can be reduced.

In the case that the resist shading mask MR is used, resolution of images can be improved. Consequently, an integrated circuit pattern having a desired shape and a desired size can be satisfactorily transferred onto a wafer.

(Embodiment 5)

Figure 36A:
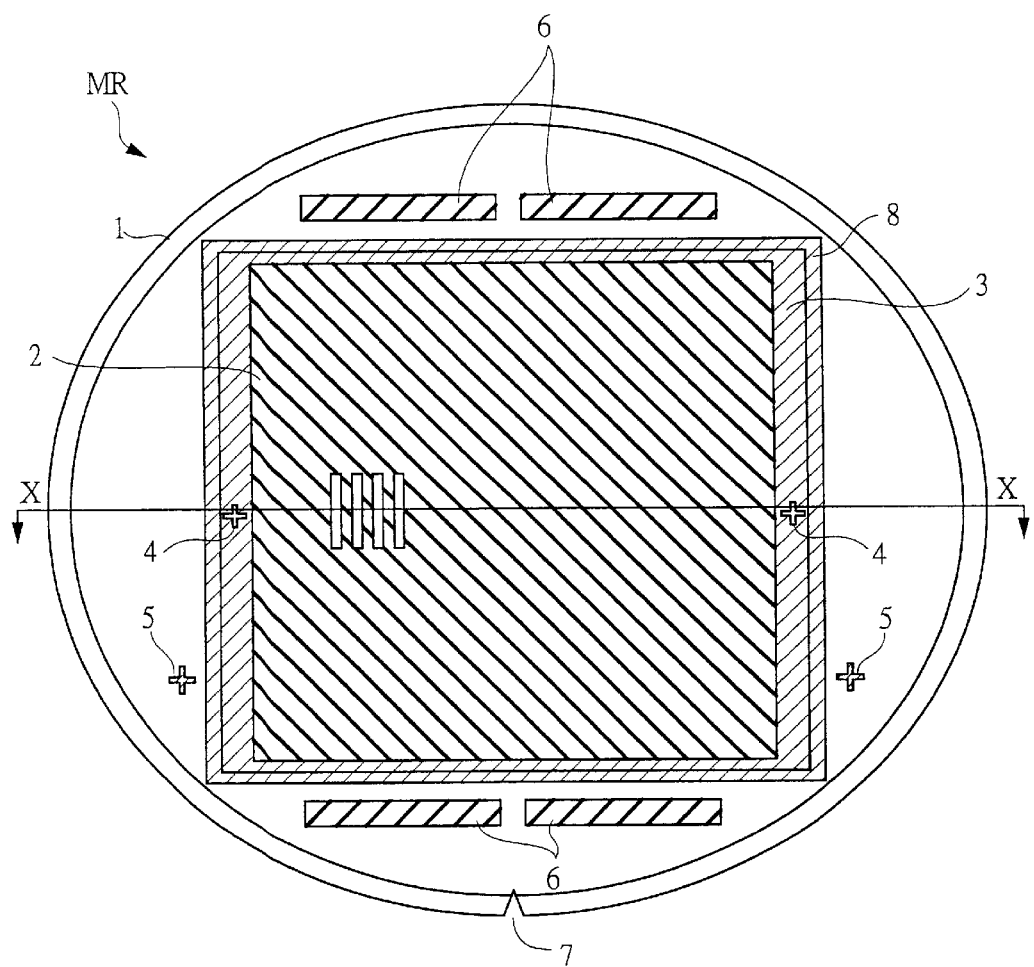
FIG. 36A is a plan view of the whole of a resist shading mask, which is an even further embodiment of the present invention.
Figure 36B:
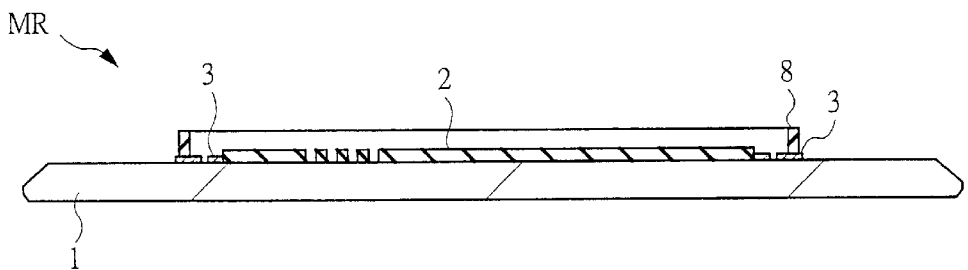
FIG. 36B is a sectional view taken along X—X line of FIG. 36A.

As illustrated in FIG. 36, in the present embodiment, the planar shape of a mask substrate 1 of a resist shading mask MR is made elliptic. The other elements and structures are the same as in the embodiment 1. If the mask substrate 1 is rotated in this case, residues of the resist film and so on may concentrate at the end of the mask substrate in the longitudinal direction. However, the distance from the circumference of the integrated circuit pattern area of the mask substrate 1 from the end of the mask substrate 1 in the longitudinal direction is longer than other distances. Therefore, if alien substances, such as the residues, strike on walls of a processing device and rebound, the alien substances can be prevented from reaching the integrated circuit pattern area of the mask substrate 1. This makes it possible to avoid the problems based on the alien substances.

The above has described the invention made by the inventors specifically on the basis of the embodiments thereof, but the present invention is not limited to these embodiments. The present invention can be variously modified within the scope that does not depart from the subject matter of the present invention.

For example, in the above-mentioned embodiments, wiring having an ordinary wiring structure has been described. However, the wiring in the present invention is not limited thereto, and may be, for example, wiring made by the so-called damascene or dual damascene process, in which an electroconductive film is embedded in grooves, for wiring or holes, made in an insulator film so as to form wiring.

In the above-mentioned embodiments, semiconductor integrated circuit devices using a semiconductor substrate made of only a semiconductor have been described. However, the semiconductor integrated circuit substrates in the present invention are not limited thereto, and may be, for example, silicon-on-insulator (SOI) substrates, in which a thin semiconductor layer is deposited on an insulator layer, or epitaxial substrates, in which an epitaxial layer is deposited on a semiconductor substrate.

In the case that a pattern such as an alignment mark is made of a resist film in the above-mentioned embodiments, it is preferred to add, to the resist film, an absorbing material which can absorb mark-detecting light [for example, probe light of a defect-examining device (i.e., light having a longer wavelength than light for exposure, such as light having a wavelength of 500 nm: information-detecting light)].

In the above-mentioned embodiments, the case in which an electron beam is used to transfer the pattern of the mask substrate 1 has been described, but the means for transferring the pattern is not limited thereto in the present invention, and may be, for example, a laser beam.

Only by making the planar shape of a mask substrate rectangular and making the chamfering structure of the circumferential end portion of the mask substrate equivalent to that of the above-mentioned embodiments, re-adhesion of alien substances such as residues of the resist film can be reduced.

The above has mainly described cases in which the invention made by the inventors is applied to a method of manufacturing a semiconductor integrated circuit device having a CMIS circuit, which is a field as the background of the invention. However, the present invention is not limited thereto, and may be applied to, for example, a method of manufacturing a semiconductor integrated circuit device having a memory circuit such as a dynamic random access memory (DRAW), a static random access memory (SRAM), or flash memory (electric erasable programmable read only memory (EEROM)), a method of manufacturing a semiconductor integrated circuit device having a logic circuit such as a microprocessor, a method of manufacturing a consolidation type semiconductor integrated circuit device, in which a memory circuit as described above and a logic circuit are mounted on the same semiconductor substrate, or a method of manufacturing some other device such as a liquid display device or a micromachine.

Brief description of advantageous effects obtained by typical aspects of the present invention is as follows.

(1) According to the present invention, by making the planar shape of a given mask substrate (i.e., a mask substrate of a mask wherein a shading pattern made of an organic film having a property of blocking off light for exposure is formed) circular, it is possible to reduce or lose re-adhesion of the organic film based on rebound of the organic film at the time of development or washing for forming the shading pattern made of the organic film on the mask substrate. Therefore, the reliability of the mask can be improved.

(2) By the item (1), the yield of semiconductor integrated circuit devices produced by exposure treatment using this mask can be improved.

(3) According to the present invention, by comparing the same patterns transferred to different areas in a substrate to be processed with each other to examine the quality of the pattern of the mask, it is sufficient that the pattern of the mask substrate is examined with a pattern-examining device for the substrate to be processed. Thus, it is unnecessary to prepare any pattern-examining device for the mask. As a result, costs for producing the mask can be reduced.

(4) According to the present invention, by making a processing device for the above-mentioned planar circular mask substrate and a processing device for the semiconductor wafer common, costs for producing the mask can be reduced.

What is claimed is:

1. A method of manufacturing a photomask comprising the steps of:

providing a mask substrate having a planar circular shape, and forming, on the mask substrate having the planar circular shape, a shading pattern made of an organic film having the property of blocking off light for exposure, wherein the step of forming the shading pattern made of the organic film comprises the steps of:

(a) depositing a light-sensitive organic film on the mask substrate having the planar circular shape;

(b) transferring a given pattern onto the light-sensitive organic film by exposure treatment; and (c) subjecting the light-sensitive organic film to developing treatment with a developing solution while the mask substrate having the planar circular shape is rotated, thereby forming the shading pattern made of the organic film.

2. The method of manufacturing the photomask according to claim 1, wherein after the developing treatment, the mask substrate having the planar circular shape is washed while the mask substrate is rotated.

3. The method of manufacturing the photomask according to claim 1, comprising the steps of:

transferring same patterns onto different areas of the mask substrate having the planar circular shape when the given pattern is transferred;

using the photomask having the shading pattern made of the organic film to expose a light-sensitive resin film on a substrate to be processed to light; and comparing the same patterns transferred onto the different areas in the substrate to be processed with each other, to examine quality of the pattern of the photomask.

4. The method of manufacturing the photomask according to claim 3, comprising the steps of:

removing the shading pattern made of the organic film when bad quality is found out by the examination; and forming again, a shading pattern made of an organic film having property of blocking off light for exposure on the mask substrate from which the shading pattern made of the organic film has been removed.

5. The method of manufacturing the photomask according to claim 1, wherein the light-sensitive organic film is a chemically-sensitizing type resist, and the developing solution is an alkaline developing solution.

6. The method of manufacturing the photomask according to claim 1, in which, in an outer circumferential end portion of the mask substrate having the planar circular shape prepared in the step (a), an edge of a first principal plane where the shading pattern made of the organic film is formed is more largely chamfered than that of a second principal plane reverse to the first principal plane.

7. The method of manufacturing the photomask according to claim 1, wherein a diameter of the mask substrate having the planar circular shape and prepared in the step (a) is equal to or smaller than that of a substrate to be processed which is exposed to light using the mask substrate.

8. The method of manufacturing the photomask according to claim 1, comprising the step of forming a phase shift pattern for reversing a phase of transmissible light on the mask substrate having the planar circular shape.

9. The method of manufacturing the photomask according to claim 1, comprising the step of forming a shading pattern made of a metal film on the mask substrate having the planar circular shape.

10. The method of manufacturing the photomask according to claim 9, wherein the shading pattern made of the metal film is formed to surround desired pattern areas; and a light-transmissible pattern for detecting information is fitted to a part of the shading pattern made of the metal film.

11. A method of manufacturing a semiconductor integrated circuit device, comprising the step of subjecting a semiconductor wafer to scale-down projective exposure treatment by exposing the semiconductor wafer to light transmitted through the photomask made by the method of claim 1, so as to transfer a pattern onto the semiconductor wafer.

12. A method of manufacturing a photomask comprising the steps of:

providing a mask substrate having a planar circular shape, and forming, on the mask substrate having the planar circular shape, a shading pattern made of an organic film having the property of blocking off light for exposure, wherein the step of forming the shading pattern made of the organic film comprises the steps of:

(a) depositing a first organic film on the mask substrate having the planar circular shape, said first organic film having a property of blocking off the light for exposure;

(b) depositing a second organic film on the first organic film, said second organic film having sensitivity to the light for exposure, which is light for pattern-transfer;

(c) transferring a given pattern onto the second organic film by exposure treatment;

(d) subjecting the second organic film to developing treatment while the mask substrate having the planar circular shape is rotated; and (e) using the second organic film patterned by the developing treatment as a mask to pattern the first organic film, thereby forming a shading pattern made of the organic films wherein the second organic film is deposited on the first organic film.

13. The method of manufacturing the photomask according to claim 12, wherein after the developing treatment, the mask substrate having the planar circular shape is washed while being rotated.

14. The method of manufacturing the photomask according to claim 12, comprising the steps of:

transferring same patterns onto different areas of the mask substrate having the planar circular shape when the given pattern is transferred;

using the photomask having the shading pattern made of the organic film to expose a light-sensitive resin film on a substrate to be processed to light, and comparing the same patterns transferred onto the different areas in the substrate to be processed with each other, to examine quality of the pattern of the photomask.

15. The method of manufacturing the photomask according to claim 14, comprising the steps of:

removing the shading pattern made of the organic film when bad quality is found out by the examination; and forming again, a shading pattern made of an organic film having property of blocking off the light for exposure on the mask substrate from which the shading pattern made of the organic film has been removed.

16. The method of manufacturing the photomask according to claim 12, wherein the light-sensitive organic film is a chemically-sensitizing type resist; and the developing solution is an alkaline developing solution.

17. The method of manufacturing the photomask according to claim 12, in which, in an outer circumferential end portion of the mask substrate having the planar circular shape and prepared in the step (a), an edge of a first principal plane where the shading pattern made of the organic film is formed is more largely chamfered than that of a second principal plane reverse to the first principal plane.

18. The method of manufacturing the photomask according to claim 12, wherein a diameter of the mask substrate having the planar circular shape prepared in the step (a) is equal to or smaller than that of a substrate to be processed which is exposed to light using the mask substrate.

19. The method of manufacturing the photomask according to claim 12, comprising the step of forming a phase shift pattern for reversing a phase of transmissible light on the mask substrate having the planar circular shape.

20. The method of manufacturing the photomask according to claim 12, comprising the step of forming a shading pattern made of a metal film on the mask substrate having the planar circular shape.

21. The method of manufacturing the photomask according to claim 20, wherein the shading pattern made of the metal film is formed to surround desired pattern areas; and a light-transmissible pattern for detecting information is fitted to a part of the shading pattern made of the metal film.

22. A method of manufacturing a semiconductor integrated circuit device, comprising the step of using a photomask wherein a shading pattern made of an organic film having property of blocking off light for exposure is arranged on a mask substrate having a planar circular shape, to subject a semiconductor wafer to scale-down projective exposure treatment, thereby transferring a given pattern onto the semiconductor wafer, wherein the shading pattern made of the organic film is made by a process comprising:

(a) depositing a light-sensitive organic film on the mask substrate having the planar circular shape;

(b) transferring a given pattern onto the light-sensitive organic film by exposure treatment; and (c) subjecting the light-sensitive organic film to developing treatment with a developing solution while the mask substrate having the planar circular shape is rotated, thereby forming the shading pattern made of the organic film.

23. The method of manufacturing the semiconductor integrated circuit device according to claim 22, comprising the step of using in common a processing device for the mask substrate having the planar circular shape in the process of manufacturing the photomask, and a processing device for the semiconductor wafer in the process of manufacturing the semiconductor integrated circuit device on the semiconductor wafer.

24. The method of manufacturing the semiconductor integrated circuit device according to claim 23, wherein a diameter of the mask substrate having the planar circular shape is equal to or smaller than that of the semiconductor wafer.

25. The method of manufacturing the semiconductor integrated circuit device according to claim 22, comprising the step of disposing a light-transmissible pattern for detecting information in a shading pattern made of a metal film and disposed in an outer circumference of an integrated circuit pattern area in the mask substrate having the planar circular shape; and then attaining relative alignment among the mask substrate having the planar circular shape, a scale-down projective exposure device and the semiconductor wafer by means of the light-transmissible pattern for detecting the information.

26. The method of manufacturing the semiconductor integrated circuit device according to claim 22, comprising the step of comparing, when the pattern of the photomask is examined, same patterns transferred onto different areas in the semiconductor wafer by exposure treatment using the photomask, thereby examining the quality of the pattern of the photomask.

* * * * *